(12) United States Patent
Endo et al.

(10) Patent No.: US 7,994,587 B2
(45) Date of Patent: Aug. 9, 2011

(54) SEMICONDUCTOR DEVICE AND SEMICONDUCTOR DEVICE MANUFACTURING METHOD

(75) Inventors: Masato Endo, Ashigarakami-gun (JP);
Kanae Uchida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 12/484,526

(22) Filed: Jun. 15, 2009

(65) Prior Publication Data
US 2010/0052061 A1 Mar. 4, 2010

(30) Foreign Application Priority Data
Aug. 29, 2008 (JP) ................................. 2008-221464

(51) Int. Cl.
*H01L 29/78* (2006.01)
(52) U.S. Cl. ................. 257/374; 257/506; 257/E29.018
(58) Field of Classification Search .................. 257/299, 257/315, 351, 374, 446, 506, E27.091, E29.018, 257/E29.02
See application file for complete search history.

(56) References Cited

U.S. PATENT DOCUMENTS

| | | | |
|---|---|---|---|
| 6,833,602 B1 | 12/2004 | Mehta | |
| 7,298,005 B2 | 11/2007 | Yoshikawa | |
| 2005/0093047 A1* | 5/2005 | Goda et al. | 257/300 |
| 2006/0220171 A1* | 10/2006 | Choi et al. | 257/500 |
| 2008/0213971 A1 | 9/2008 | Mitsuhira et al. | |

FOREIGN PATENT DOCUMENTS

| | | |
|---|---|---|
| JP | 2005-294795 | 10/2005 |
| JP | 2006-80310 | 3/2006 |
| JP | 2006-80492 | 3/2006 |

* cited by examiner

*Primary Examiner* — Thomas L Dickey
(74) *Attorney, Agent, or Firm* — Oblon, Spivak, McClelland, Maier & Neustadt, L.L.P.

(57) ABSTRACT

A semiconductor device includes a plurality of first MOS transistors has a first gate electrode formed on a first gate insulating film provided on a semiconductor substrate, a plurality of second MOS transistors has a second gate electrode formed on a second gate insulating film which is provided on the substrate and which is smaller in thickness than the first gate insulating film. A first element isolation region has a first region and a second region, a bottom surface of the second region is deeper than that of the first region by the difference of thickness between the first gate insulating film and the second gate insulating film, and a bottom surface of the first region is equal in a bottom surface of a second element isolation region.

20 Claims, 25 Drawing Sheets

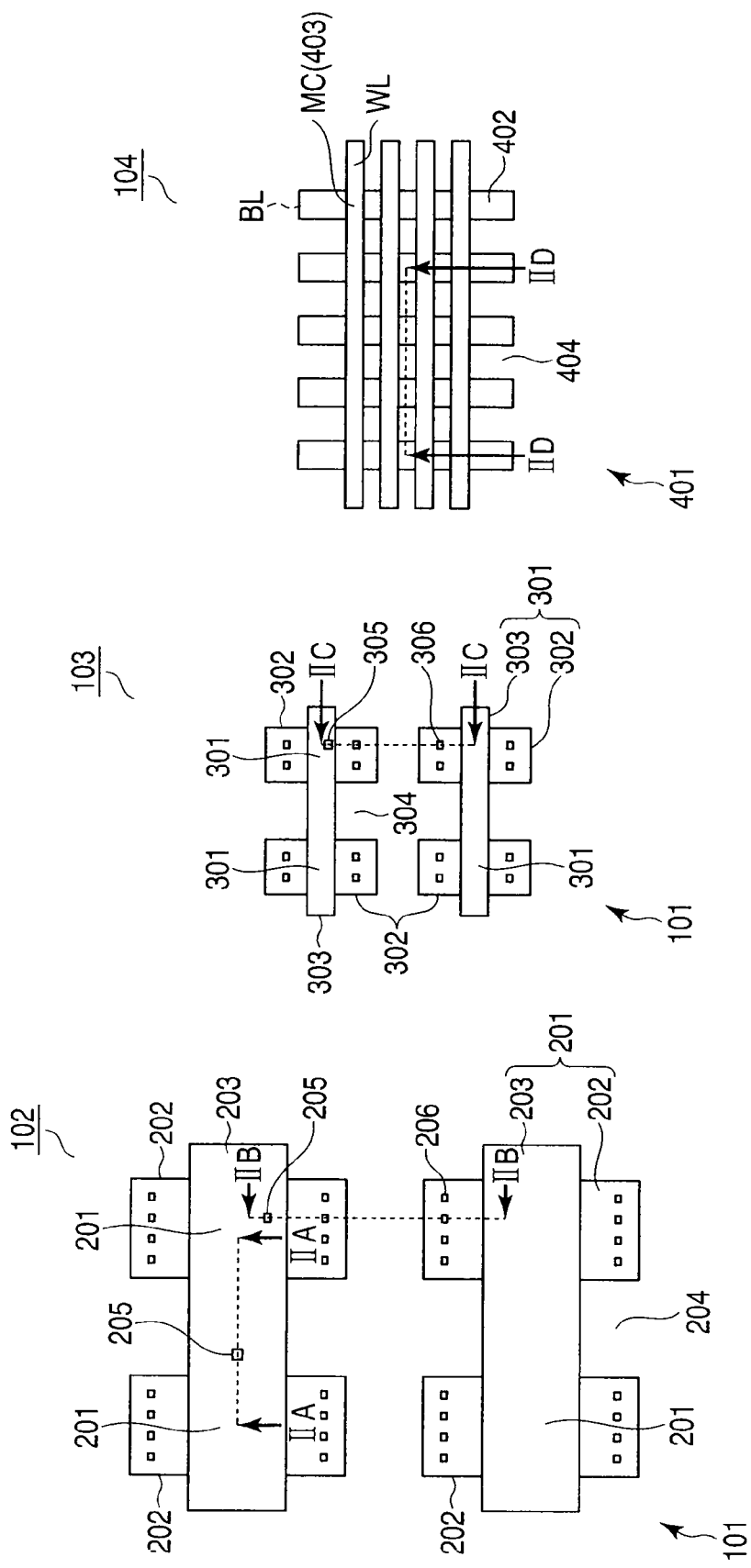

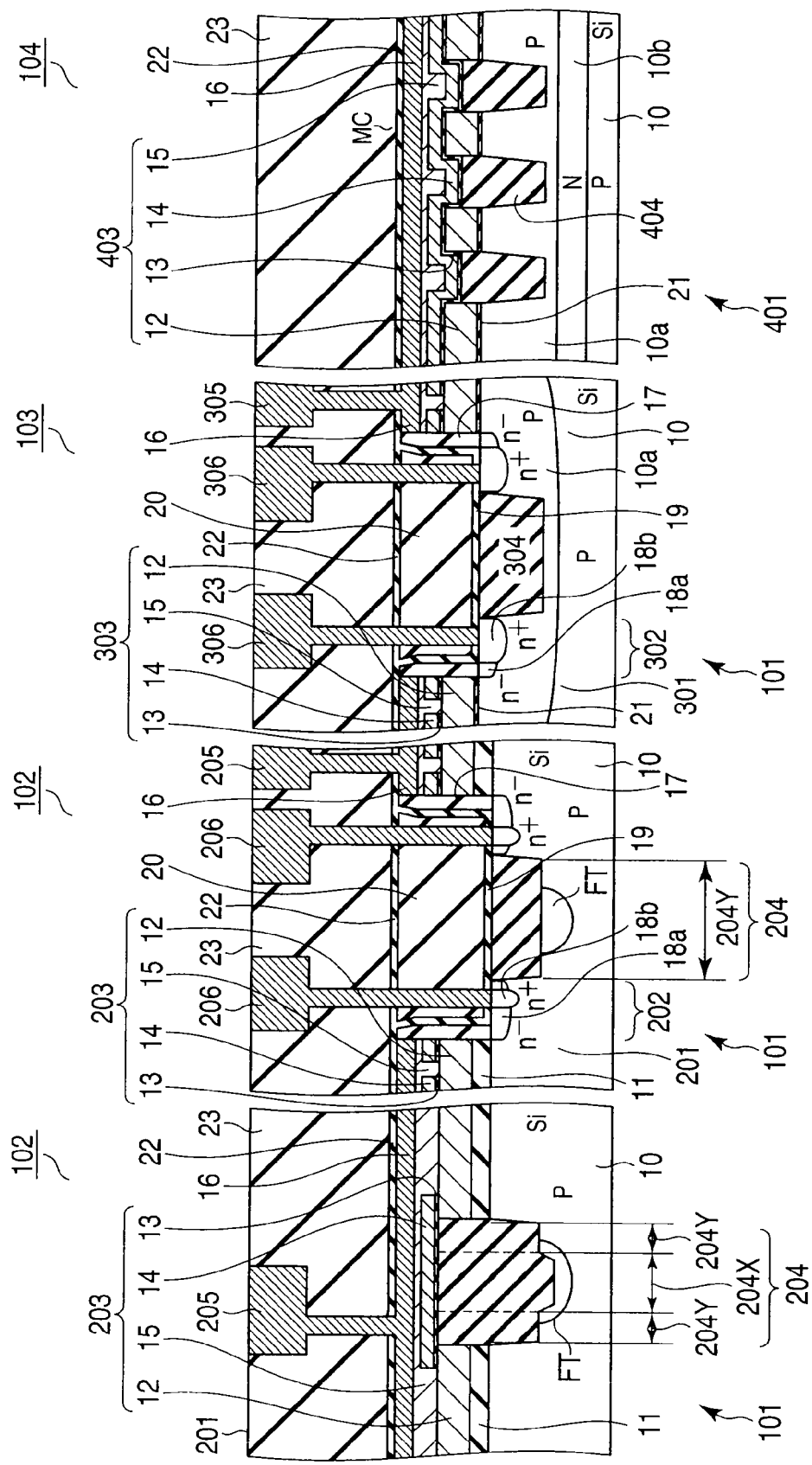

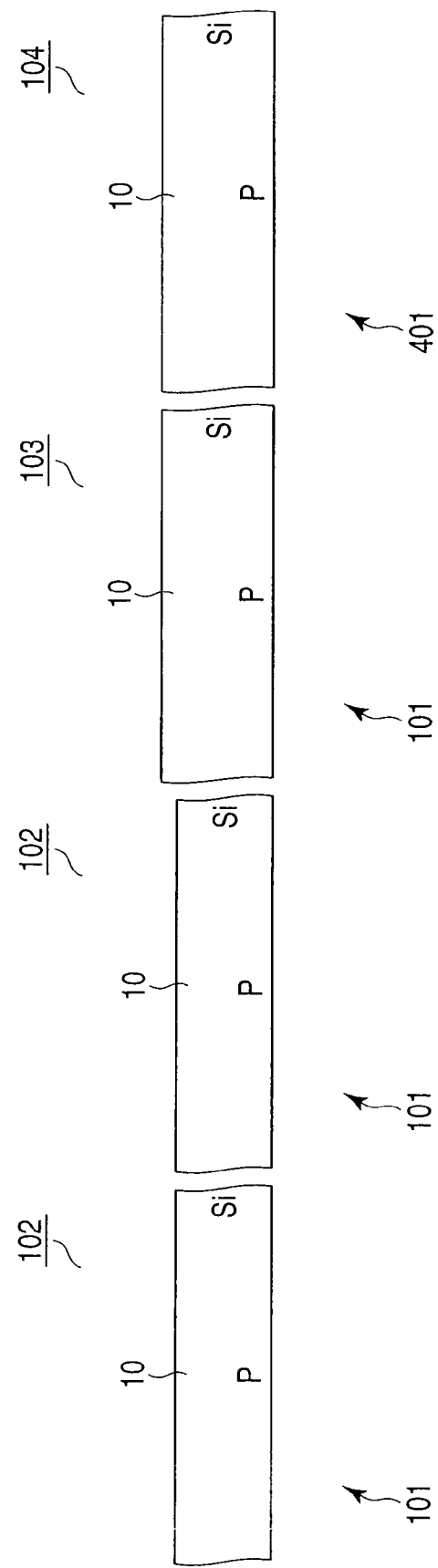

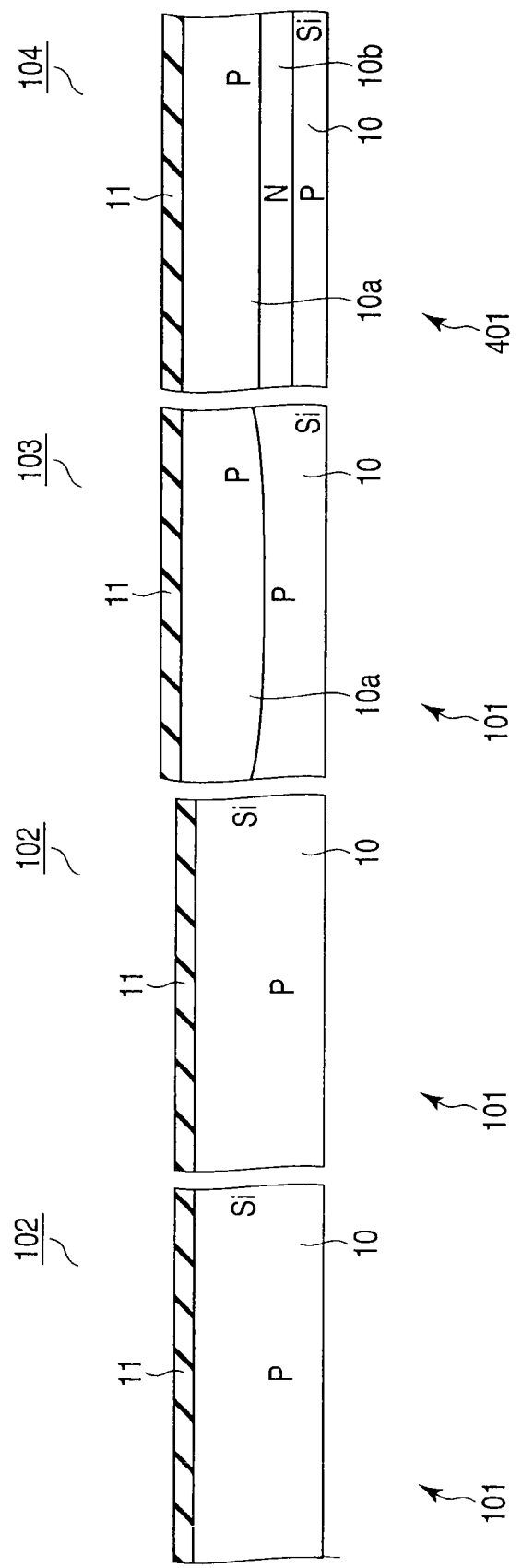

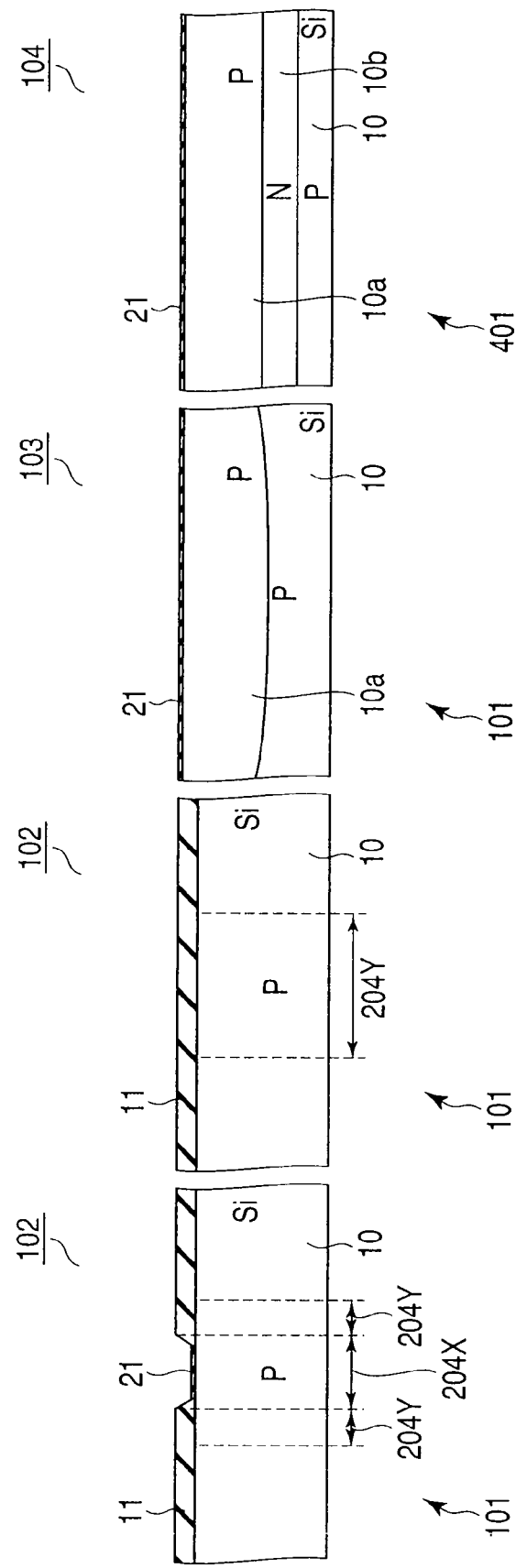

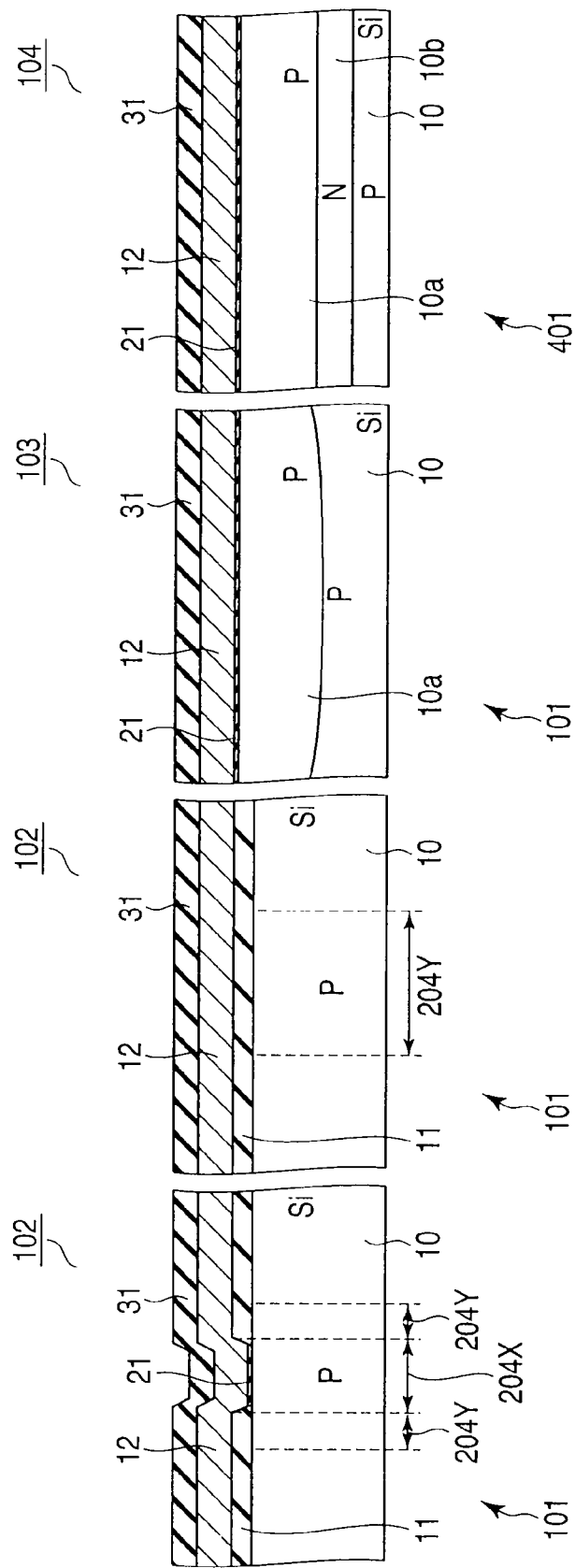

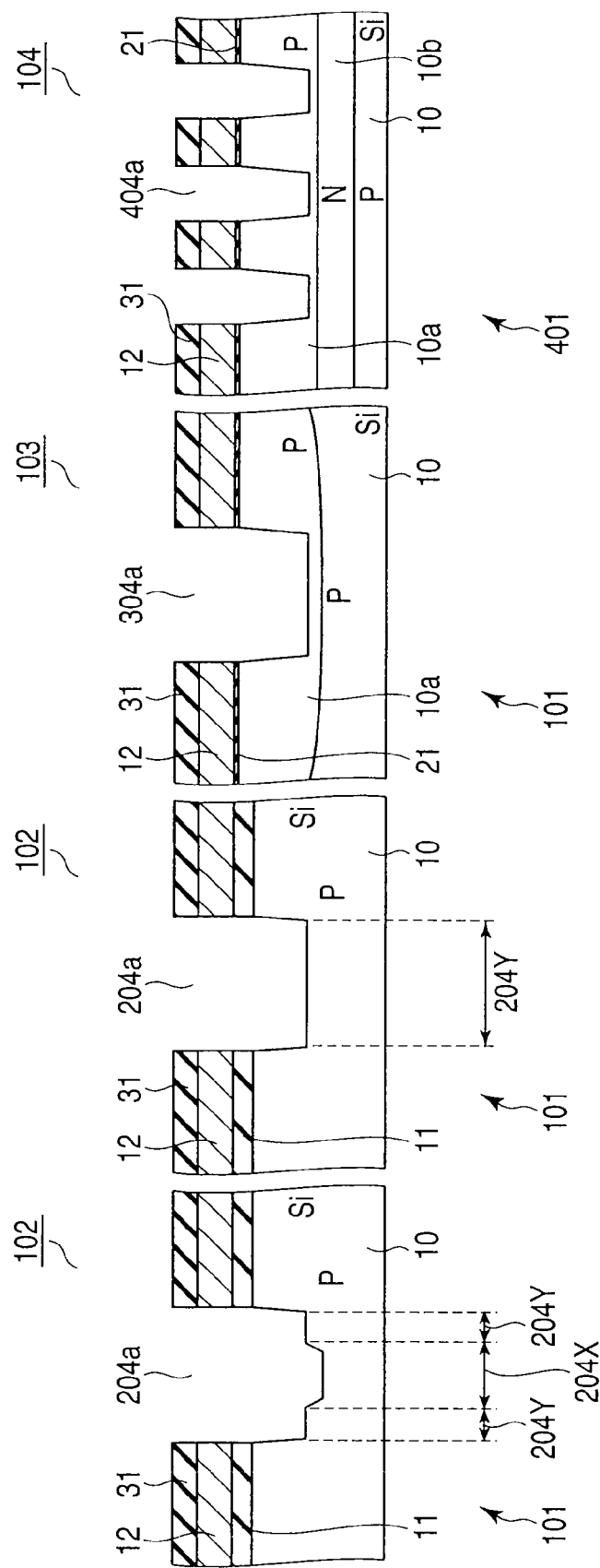

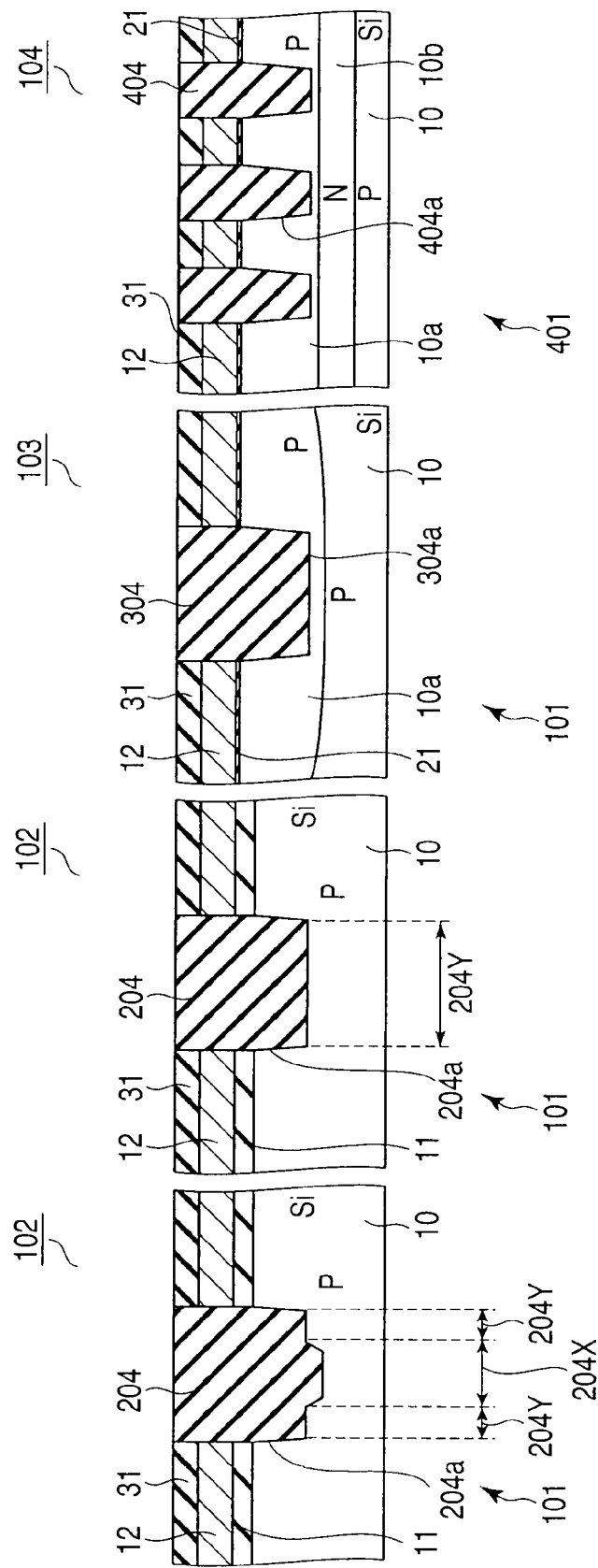

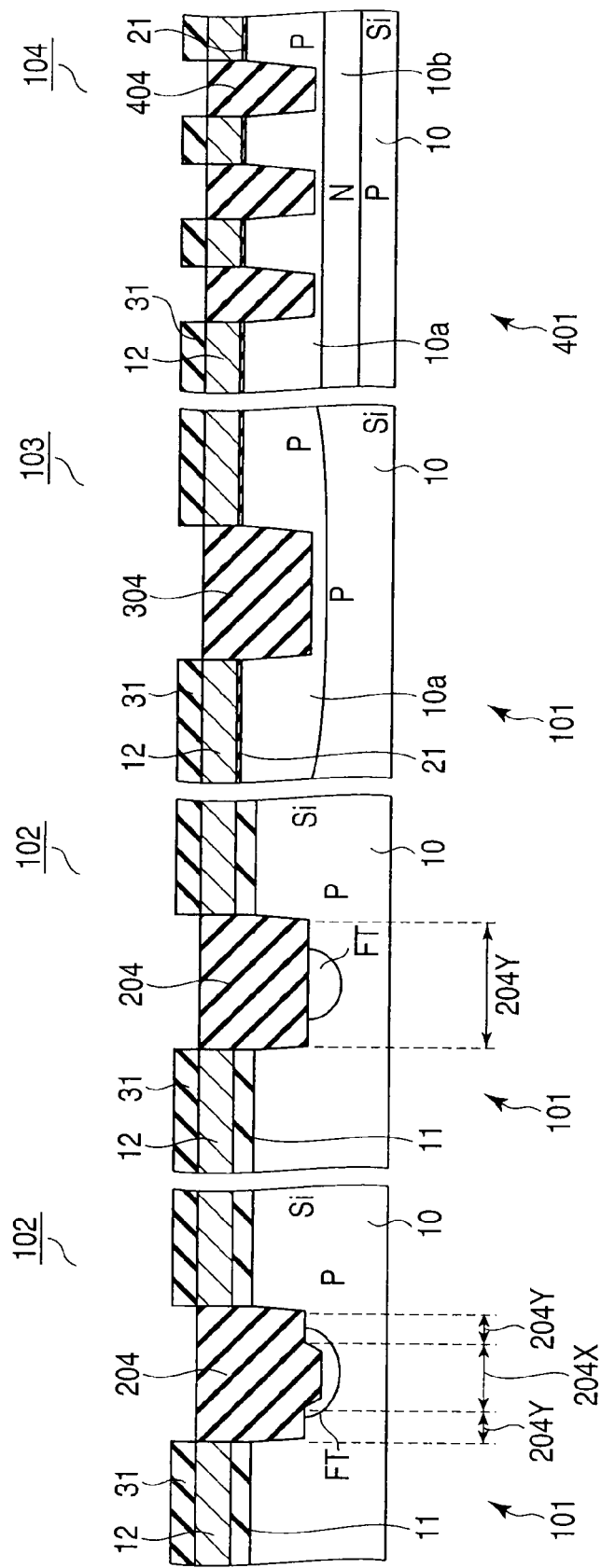

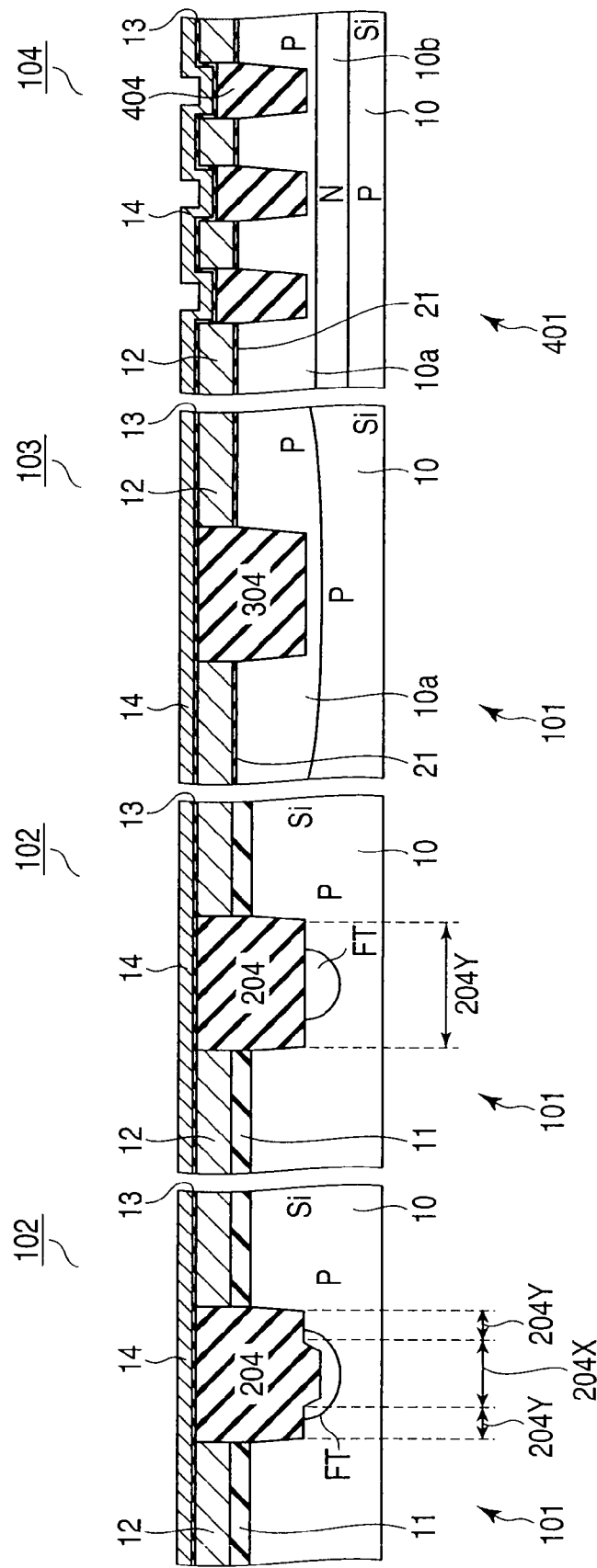

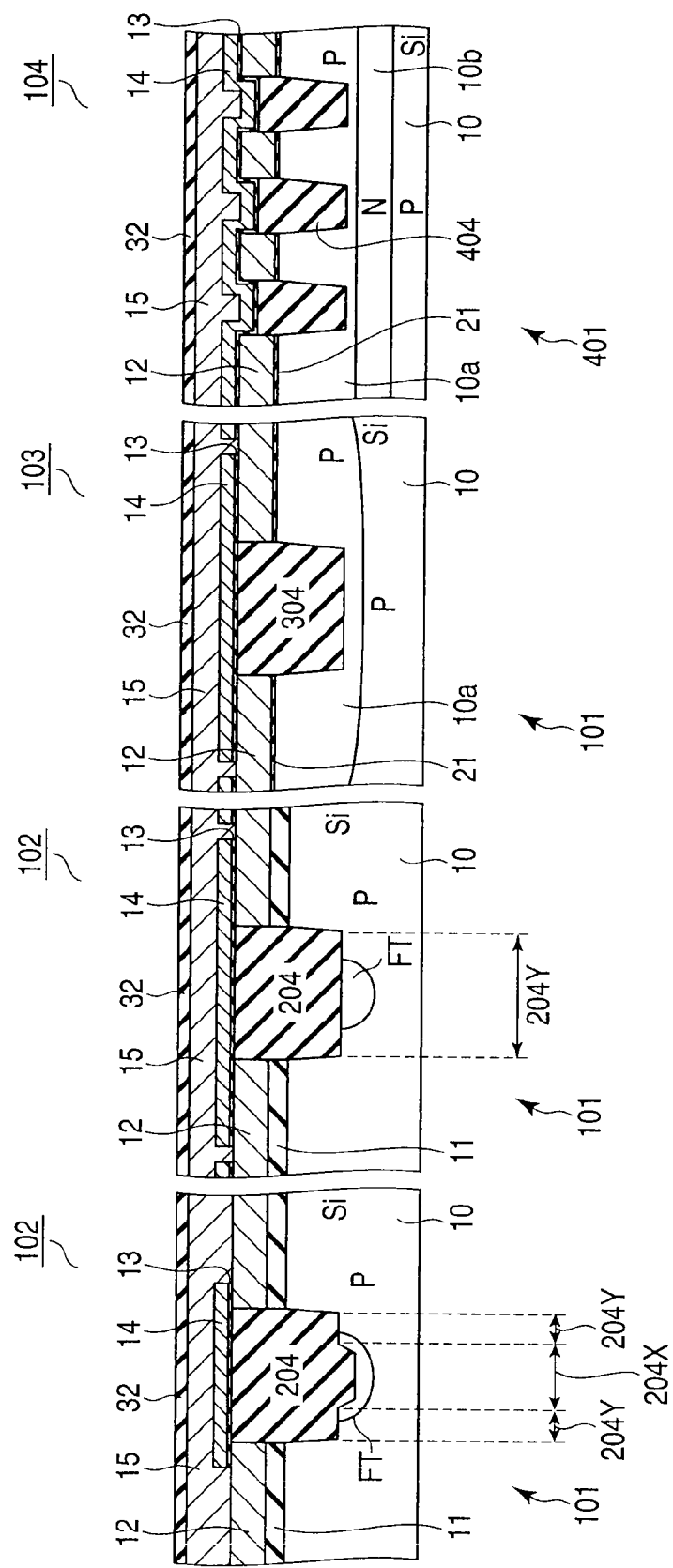

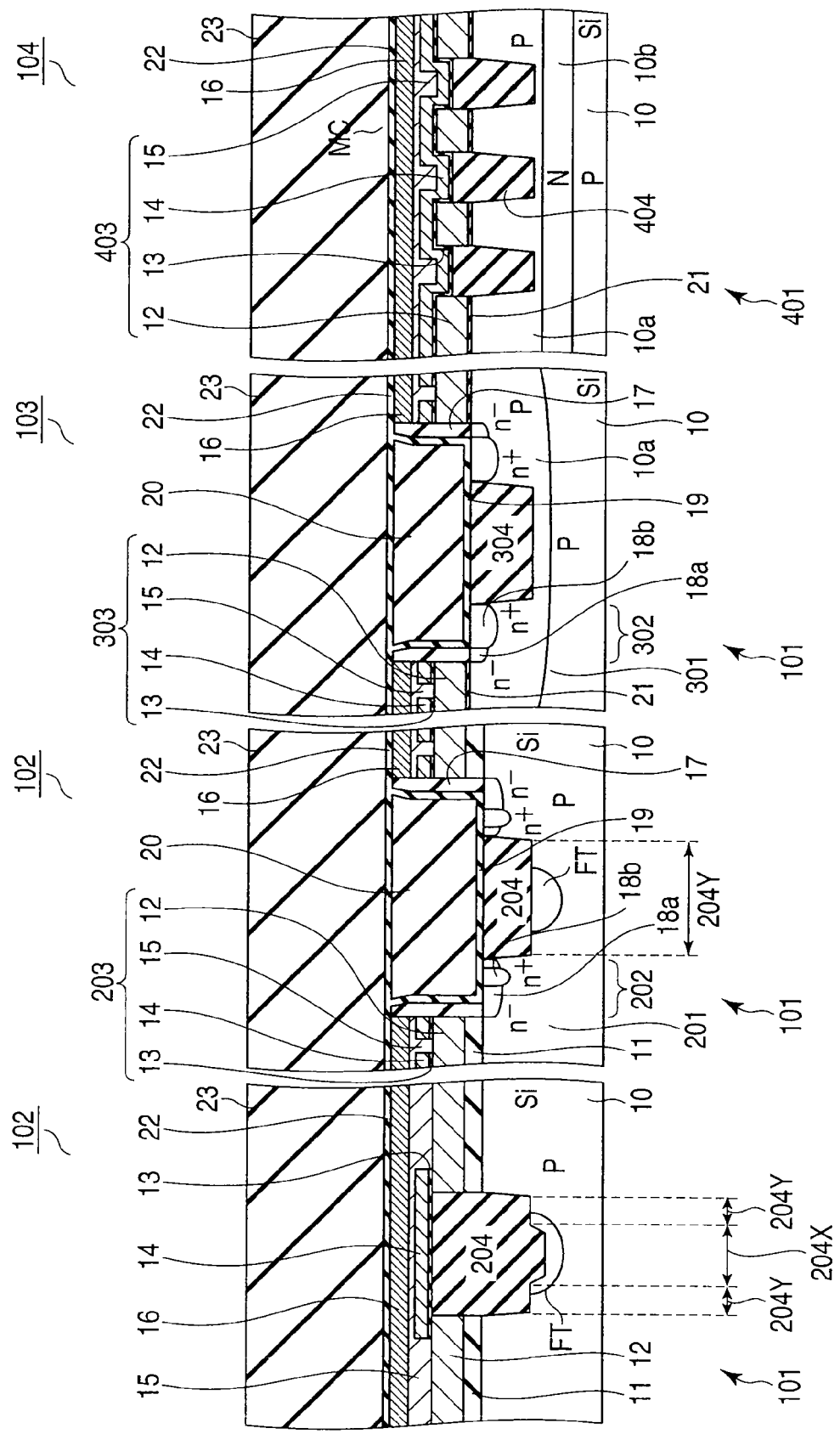

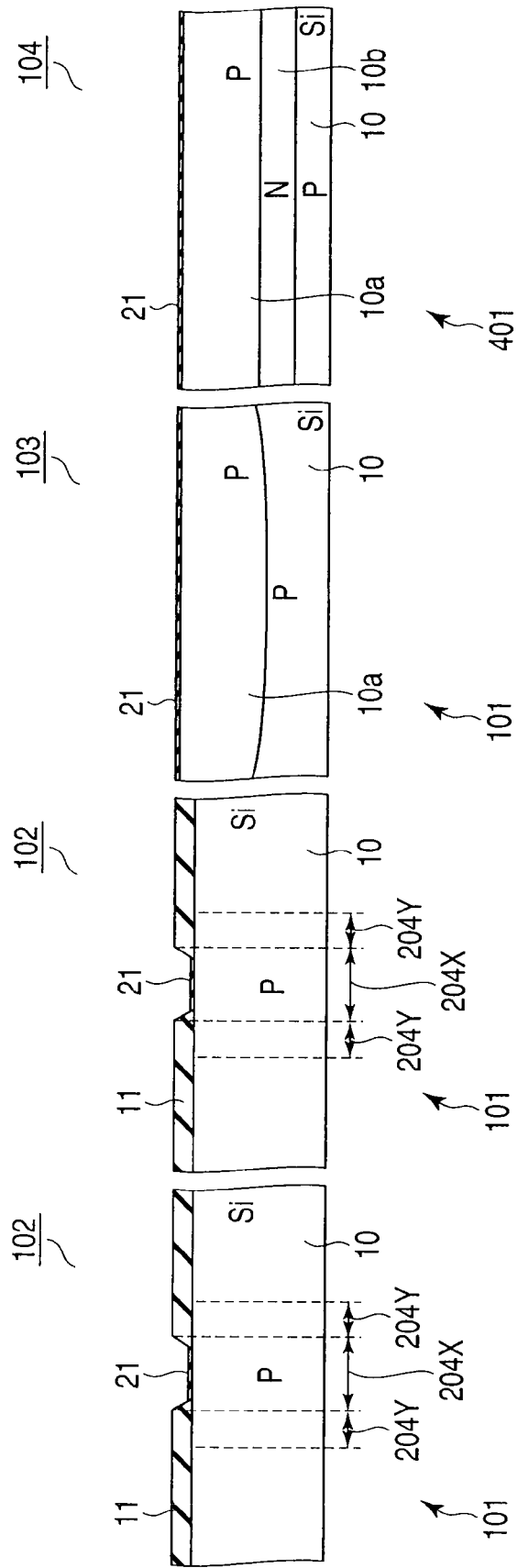

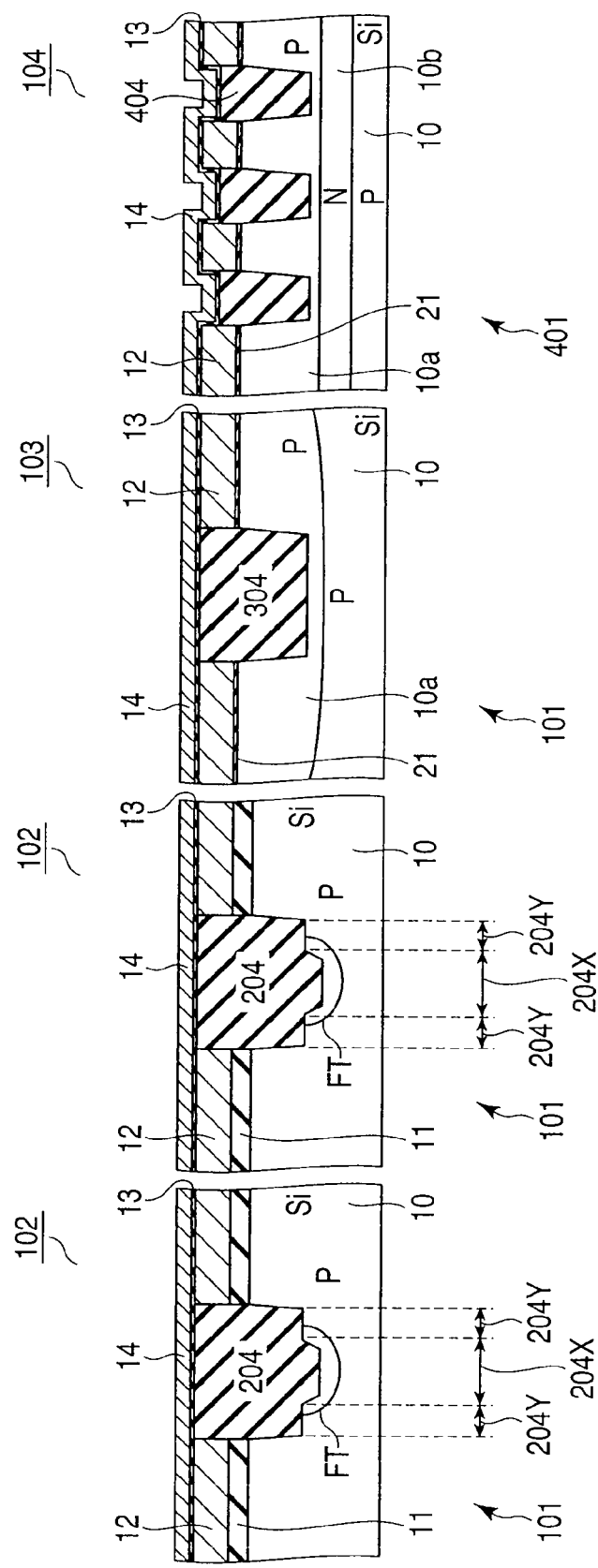

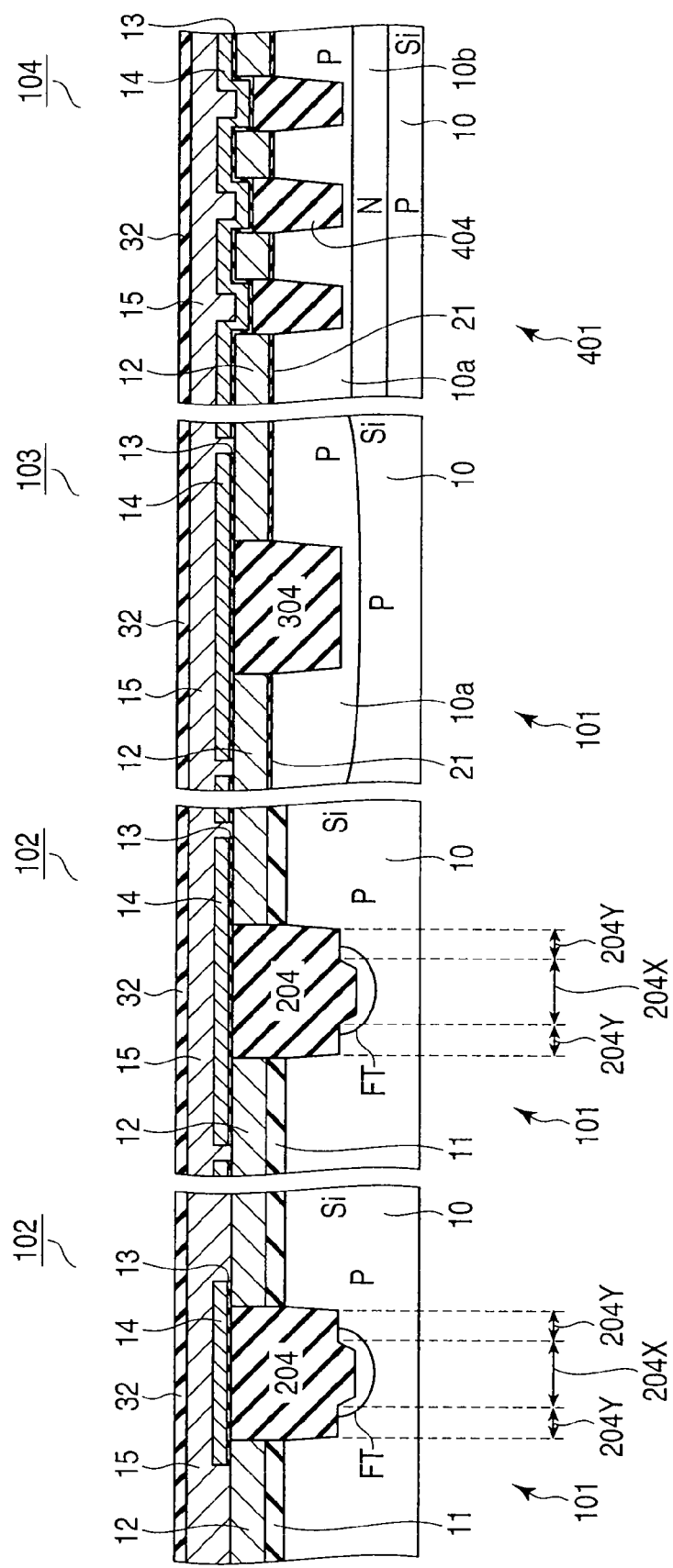

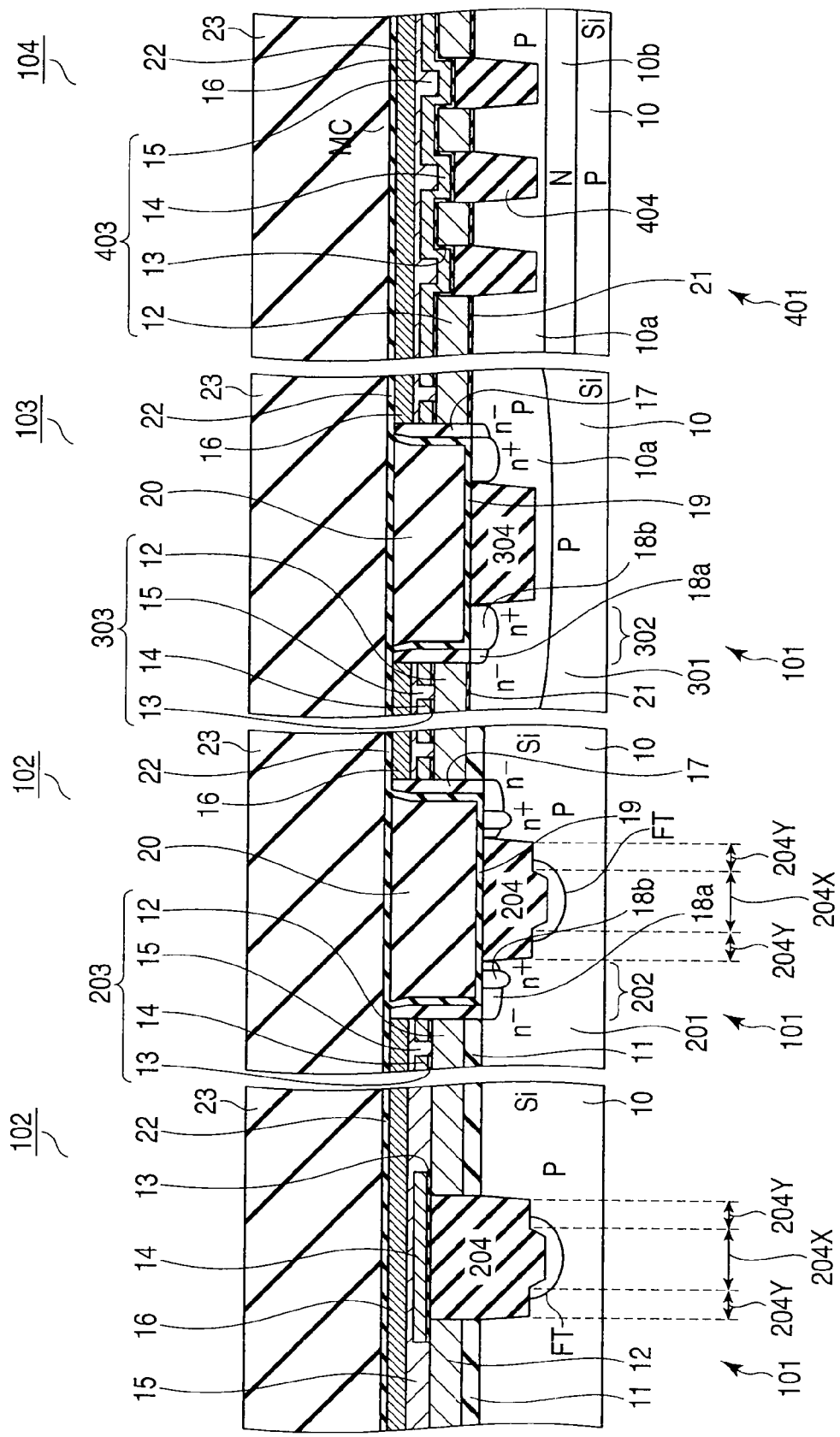

SEMICONDUCTOR DEVICE AND SEMICONDUCTOR DEVICE MANUFACTURING METHOD

CROSS-REFERENCE TO RELATED APPLICATIONS

This application is based upon and claims the benefit of priority from prior Japanese Patent Application No. 2008-221464, filed Aug. 29, 2008, the entire contents of which are incorporated herein by reference.

BACKGROUND OF THE INVENTION

1. Field of the Invention

The present invention relates to a semiconductor device and a manufacturing method thereof. More particularly, it relates to a nonvolatile semiconductor memory device which has a low-voltage (LV) transistor region and a high-voltage (HV) transistor region in a peripheral circuit section and which has a different element isolation structure in each of the regions.

2. Description of the Related Art

A NAND-type flash memory, for example, is a nonvolatile semiconductor memory device capable of electric rewriting (writing and erasing) of data. In this flash memory, a plurality of transistor circuits (peripheral circuit sections) are arranged around a memory cell section. The peripheral circuit sections of the flash memory are roughly classified into an LV transistor region and an HV transistor region.

Recently, element isolation regions have been increasingly miniaturized in the NAND-type flash memory. There has already been proposed a method of forming a silicon oxide film of, for example, non-doped silicate glass (NSG) by a coating method in the process of forming an embedded element isolation insulating film serving as shallow trench isolation (STI) (see, for example, Jpn. Pat. Appln. KOKAI Publication No. 2006-80942). That is, the coating method is used for the formation of the embedded element isolation insulating film in order to form a micro STI.

In particular, as compared with a polysilicon film, a polysilazane (PSZ) film formed by the coating method has good coverage characteristics and is therefore advantageous to the formation of the micro STI.

However, the PSZ film has the strong contraction stress. Thus, when the PSZ film is used for the STI of the peripheral circuit region, crystal defects tend to be happened in the LV transistor region, thus there is concern about problems such as junction leakage. This problem is dependent on the amount of the PSZ film and can be alleviated by reducing the amount of the film, that is, by reducing the depth of the STI. However, as the STIs in the LV and HV transistor regions of the peripheral circuit region are simultaneously formed, the reduction of the depth of the STI then leads to a problem such as an STI inversion leakage in the HV transistor region.

In addition, as a means of solving the above-mentioned problem, there has already been made a proposal that an STI is shaped to have a downward projection (see, for example, U.S. patent application U.S. Pat. No. 6,833,602).

As described above, a device having a shallow STI in an LV transistor region and a deep STI in an HV transistor region at the same time has been desired.

BRIEF SUMMARY OF THE INVENTION

According to a first aspect of the present invention, there is provided a semiconductor device comprising: a semiconductor substrate; a first gate insulating film and a second gate insulating film, the first gate insulating film being provided in a first transistor region on the semiconductor substrate, the second gate insulating film being provided in a second transistor region on the semiconductor substrate and being smaller in thickness than the first gate insulating film; a plurality of first metal oxide semiconductor (MOS) transistors formed on the first gate insulating film and each of the first MOS transistors has a first gate electrode; a plurality of second MOS transistors formed on the second gate insulating film and each of the second MOS transistors has a second gate electrode; a first element isolation region in the first transistor region, the first element isolation region being provided between the plurality of first MOS transistors, the first element isolation region being formed by embedding an insulating film in the semiconductor substrate; and a second element isolation region in the second transistor region, the second element isolation region being provided between the plurality of second MOS transistors, the second element isolation region being formed by embedding the insulating film in the semiconductor substrate, wherein the first element isolation region has a first region and a second region; a bottom surface of the second region is deeper than that of the first region by the difference of thickness between the first gate insulating film and the second gate insulating film; and a bottom surface of the first region is equal in a bottom surface of the second element isolation region.

According to a second aspect of the present invention, there is provided a semiconductor device comprising: a semiconductor substrate of a first conductivity type having a first transistor region, a second transistor region and a memory cell region; a first gate insulating film, a second gate insulating film and a third gate insulating film, the first gate insulating film being provided in the first transistor region on the semiconductor substrate, the second gate insulating film being provided in the second transistor region on the semiconductor substrate and being smaller in thickness than the first gate insulating film, the third gate insulating film being provided in the memory cell region on the semiconductor substrate and being equal in thickness to the second gate insulating film; a plurality of first metal oxide semiconductor (MOS) transistors formed on the first gate insulating film and each of the first MOS transistors has first gate electrode; a plurality of second MOS transistors formed on the second gate insulating film and each of the second MOS transistors has second gate electrode, the plurality of second MOS transistors operating at a lower voltage than the plurality of first MOS transistors; a plurality of memory cell transistors formed on the third gate insulating film and having third gate electrode; a first element isolation region in the first transistor region, the first element isolation region being provided between the plurality of first MOS transistors, the first element isolation region being formed by embedding an insulating film in the semiconductor substrate; a second element isolation region in the second transistor region, the second element isolation region being provided between the plurality of second MOS transistors, the second element isolation region being formed by embedding the insulating film in the semiconductor substrate; and a third element isolation region in the memory cell region, the third element isolation region being provided between the plurality of memory cell transistors, the third element isolation region being formed by embedding the insulating film in the semiconductor substrate, wherein the first element isolation region has a first region and a second region; a bottom surface of the second region is deeper than that of the first region by the difference of thickness between the first gate insulating film and the second gate insulating film; and a bottom surface of the first region is equal in a bottom surface of the second element isolation region.

According to a third aspect of the present invention, there is provided a semiconductor device manufacturing method comprising: forming a first gate insulating film in a first part of a first transistor region on a semiconductor substrate; forming a second gate insulating film in a second transistor region on the semiconductor substrate, the second gate insulating film being smaller in thickness than the first gate insulating film, and also forming the second gate insulating film in a second part of the first transistor region; forming a first trench in the first part of the first transistor region, forming a second trench in the second part, a bottom of the second trench being deeper than that of the first trench by the difference of thickness between the first gate insulating film and the second gate insulating film, and forming a third trench in the second transistor region, a bottom of the third trench being equal in depth to that of the first trench; embedding an insulating film in the first trench and the second trench to form a first element isolation region, and embedding the insulating film in the third trench to form a second element isolation region; and forming, via the first gate insulating film, a plurality of first metal oxide semiconductor (MOS) transistors in the first transistor region where the first element isolation region is formed, the plurality of first MOS transistors having first gate electrode, and forming, via the second gate insulating film, a plurality of second MOS transistors in the second transistor region where the second element isolation region is formed, the plurality of second MOS transistors having second gate electrode.

BRIEF DESCRIPTION OF THE SEVERAL VIEWS OF THE DRAWING

FIGS. 1A to 1C are plan views showing an example of the configuration of a semiconductor device (NAND-type flash memory) according to a first embodiment of the present invention;

FIGS. 2A to 2D are sectional views showing the example of the configuration of the NAND-type flash memory according to the first embodiment;

FIGS. 3A to 3D are sectional views shown to explain the process of manufacturing the NAND-type flash memory according to the first embodiment;

FIGS. 4A to 4D are sectional views shown to explain the process of manufacturing the NAND-type flash memory according to the first embodiment;

FIGS. 5A to 5D are sectional views shown to explain the process of manufacturing the NAND-type flash memory according to the first embodiment;

FIGS. 6A to 6D are sectional views shown to explain the process of manufacturing the NAND-type flash memory according to the first embodiment;

FIGS. 7A to 7D are sectional views shown to explain the process of manufacturing the NAND-type flash memory according to the first embodiment;

FIGS. 8A to 8D are sectional views shown to explain the process of manufacturing the NAND-type flash memory according to the first embodiment;

FIGS. 9A to 9D are sectional views shown to explain the process of manufacturing the NAND-type flash memory according to the first embodiment;

FIGS. 10A to 10D are sectional views shown to explain the process of manufacturing the NAND-type flash memory according to the first embodiment;

FIGS. 11A to 11D are sectional views shown to explain the process of manufacturing the NAND-type flash memory according to the first embodiment;

FIGS. 15A to 15D are sectional views shown to explain the process of manufacturing the NAND-type flash memory according to the first embodiment;

FIGS. 17A to 17D are sectional views shown to explain the process of manufacturing the NAND-type flash memory according to Modification 1 of the first embodiment;

FIGS. 20A to 20D are sectional views shown to explain the process of manufacturing the NAND-type flash memory according to Modification 1 of the first embodiment;

FIGS. 21A to 21D are sectional views shown to explain the process of manufacturing the NAND-type flash memory according to Modification 1 of the first embodiment;

FIGS. 25A to 25D are sectional views shown to explain the process of manufacturing the NAND-type flash memory according to Modification 1 of the first embodiment.

DETAILED DESCRIPTION OF THE INVENTION

Figures 12A, 12B, 12C, 12D:
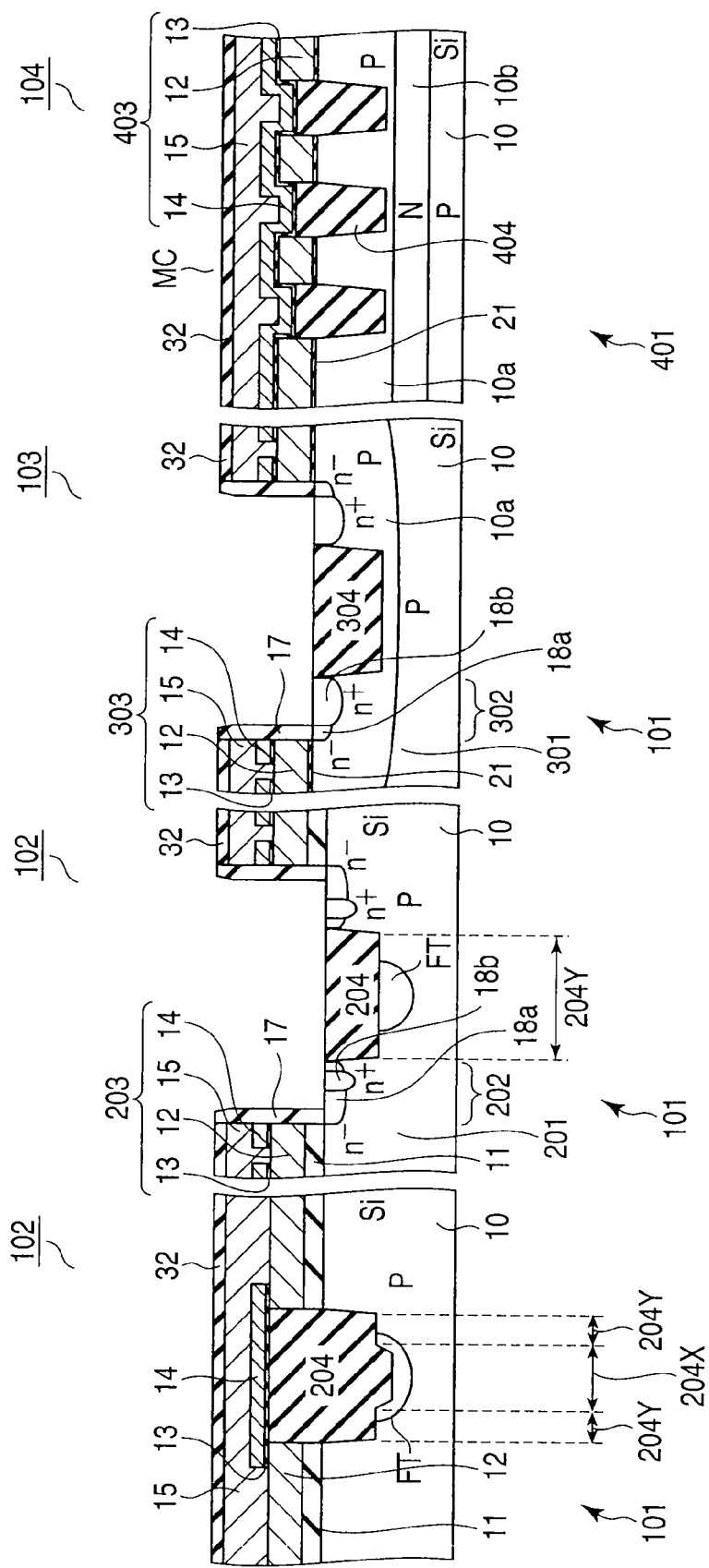
FIGS. 12A to 12D are sectional views shown to explain the process of manufacturing the NAND-type flash memory according to the first embodiment.

Embodiments of the present invention will be described with reference to the accompanying drawings. It should be noted that the drawings are schematic ones and so are not to scale. The following embodiments are directed to a device and a method for embodying the technical concept of the present invention, and the technical concept does not specify the material, shape, structure or configuration of components of the present invention. Various changes and modifications can be made to the technical concept without departing from the scope of the claimed invention.

First Embodiment

FIGS. 1A to 1C and FIGS. 2A to 2D show an example of the configuration of a semiconductor device according to a first embodiment of the present invention. In the present embodiment, a NAND-type flash memory, which is a non-volatile semiconductor memory device, is described as an example of a semiconductor device having different element isolation structures in an LV transistor region and an HV transistor region. FIG. 1A is a plan view schematically showing an HV transistor region of a peripheral circuit section in a memory chip, FIG. 1B is a plan view schematically showing an LV transistor region of the peripheral circuit section, and FIG. 1C is a plan view schematically showing a memory cell section. FIG. 2A is a sectional view of the HV transistor region along the line IIA-IIA (channel width direction) in FIG. 1A, FIG. 2B is a sectional view of the HV transistor region along the line IIB-IIB (channel length direction) in FIG. 1A, FIG. 2C is a sectional view of the LV transistor region along the line IIC-IIC (channel length direction) in FIG. 1B, and FIG. 2D is a sectional view of the memory cell section along the line IID-IID (word line direction) in FIG. 1C.

As shown in FIG. 1A, a plurality of HV transistors (in this example, n-type first metal oxide semiconductor (MOS) transistors) 201 are formed in an HV transistor region (first transistor region) 102 of a peripheral circuit section 101 on a chip. Each of the HV transistors 201 is disposed at the intersection of an element region 202 and a gate electrode unit 203. In this example, the gate electrode unit (first gate electrode unit) 203 is disposed across two element regions 202, thereby constituting a set (pair) of HV transistors 201, 201. The element region 202 is enclosed by an element isolation region (STI) 204 which is formed by embedding a coating film (insulating film) such as a PSZ film having the strong contraction stress. In addition, the HV transistors 201, 201 are generally arranged at random in the HV transistor region 102.

In a section along the line IIA-IIA, the gate electrode unit 203 of the HV transistor 201 is provided on a P-type Si (silicon) substrate 10 of a first conductivity type via a gate insulating film (first gate insulating film) 11 having a thickness of about 40 nm, as shown in, for example, FIG. 2A. The gate electrode unit 203 has a configuration in which a third electrode film 15 is stacked on a first electrode film 12 via an intergate insulating film (third insulating film) 13 and a second electrode film 14 that are selectively provided. A metal salicide film 16 is provided on the gate electrode unit 203 for reducing resistance. The intergate insulating film 13 and the second electrode film 14 are partly located on the first electrode film 12, and are provided to cover the upper surface of the STI 204 between the element regions 202. The upper surface of the STI 204 in this section is substantially equal in height to the upper surface of the first electrode film 12.

In addition, instead of having the single-layer PSZ film, the STI 204 may have, for example, a double-layer structure. The double-layer structure includes insulating film such as a silicon oxide film is formed in the part in contact with the Si substrate 10 and PSZ film formed on the silicon oxide film.

On the other hand, in a section along the line IIB-IIB, a spacer film 17 formed of a fourth insulating film is provided along the sidewall of the gate electrode unit 203 on the Si substrate 10 corresponding to the element region 202, as shown in, for example, FIG. 2B. Diffusion layer regions 18a(n−), 18b(n+) having an LDD structure are formed on the surface part of the Si substrate 10 corresponding to the element region 202. A fifth insulating film 19 and a sixth insulating film 20 are formed on the STI 204 as well as on the diffusion layer regions 18a, 18b. The upper surface of the STI 204 in this section (IIB-IIB) is, but not exclusively, substantially equal in height to the upper surface of the Si substrate 10.

As shown in FIG. 1B, a plurality of LV transistors (in this example, n-type second MOS transistors) 301 are formed in an LV transistor region (second transistor region) 103 of the peripheral circuit section 101 on the chip. Each of the LV transistors 301 is disposed at the intersection of an element region 302 and a gate electrode unit (second gate electrode unit) 303. In this example, the gate electrode unit 303 is disposed across two element regions 302, thereby constituting a set (pair) of LV transistors 301, 301. The element region 302 is enclosed by an element isolation region (STI) 304 formed by embedding a coating film such as a PSZ having the strong contraction stress. In addition, the LV transistors 301, 301 are generally arranged at random in the LV transistor region 103.

In a section along the line IIC-IIC, the gate electrode unit 303 of the LV transistor 301 is provided on the Si substrate 10 via a gate insulating film (second gate insulating film) 21 having a thickness of about 8 nm, as shown in, for example, FIG. 2C. When the LV transistor 301 is an n-type transistor, a P-well region 10a higher in impurity concentration than the Si substrate 10 is formed in the Si substrate 10 corresponding to the LV transistor region 103. When the LV transistor 301 is a p-type transistor, an N-well region is formed in the Si substrate 10 corresponding to the LV transistor region 103.

The gate electrode unit 303 has a configuration in which a third electrode film 15 is stacked on a first electrode film 12 via an intergate insulating film (third insulating film) 13 and a second electrode film 14 that are selectively provided. A metal salicide film 16 is provided on the gate electrode unit 303 for reducing resistance. The intergate insulating film 13 and the second electrode film 14 are partly located on the first electrode film 12 in another section (an unshown section in a direction perpendicular to the line IIC-IIC), and are provided to cover the upper surface of the STI 304 between the element regions 302. The upper surface of the STI 304 in this section is, but not exclusively, substantially equal in height to the upper surface of the Si substrate 10.

In addition, instead of having the single-layer PSZ film, the STI 304 may have, for example, a double-layer structure. The double-layer structure includes an insulating film such as a silicon oxide film is formed in the part in contact with the Si substrate 10 and PSZ film formed on the silicon oxide film.

Furthermore, in a section along the line IIC-IIC, a spacer film 17 formed of a fourth insulating film is provided along the sidewall of the gate electrode unit 303 on the Si substrate 10 corresponding to the element region 302, as shown in, for example, FIG. 2C. Diffusion layer regions 18a(n−), 18b(n+) having an LDD structure are formed on the surface part of the Si substrate 10 corresponding to the element region 302. A fifth insulating film 19 and a sixth insulating film 20 are formed on the STI 304 as well as on the diffusion layer region 18b.

In addition, the upper surface of the gate insulating film 21 provided in the LV transistor region 103 is substantially equal in height to the upper surface of the gate insulating film 11 provided in the HV transistor region 102.

As shown in FIG. 1C, a plurality of memory cell transistors MC are formed in a cell region (cell array) 104 of a memory cell section 401 on the chip. The memory cell transistor MC is a MOS transistor having a gate electrode unit (third gate electrode unit) 403 of a stack gate electrode structure, and each of the memory cell transistors MC is disposed at the intersection of a word line (control gate electrode) WL and a bit line BL. The gate electrode unit 403 includes a control gate electrode and a floating gate electrode. For example, an FN tunnel current is used to bring a charge (electrons) in or out of the floating gate electrode such that data is rewritten (program and erase) in the memory cell transistors MC. In general, a condition in which electrons are injected in the floating gate electrode is "0" data, and a condition in which no electrons are injected is "1" data. The floating gate electrodes are provided to correspond to element regions 402, and the control gate electrode is disposed across the plurality of element regions 402. The element region 402 is enclosed by an element isolation region (STI) 404 formed by embedding a coating film such as a PSZ film having the strong contraction stress.

In addition, instead of having the single-layer PSZ film, the STI 404 may have, for example, a double-layer structure. The double-layer structure includes an insulating film such as a silicon oxide film is formed in the part in contact with the Si substrate 10 and PSZ film formed on the silicon oxide film.

In a section in a WL direction along the line IID-IID, as shown in, for example, FIG. 2D, the gate electrode unit 403 of the memory cell transistor MC has a stack configuration including: a first electrode film 12 which serves as a floating gate electrode and which is provided on the Si substrate 10 via a gate insulating film (third gate insulating film) 21 as a tunnel insulating film having a thickness of about 8 nm; a second electrode film 14 which serves as a first control gate electrode and which is provided via an intergate insulating film (third insulating film) 13 formed continuously from the upper surface and side surface of the first electrode film 12 onto the STI 404; and a third electrode film 15 which serves as a second control gate electrode. A metal salicide film 16 is provided on the gate electrode unit 403 for reducing resistance. The upper surface of the STI 404 in this region is higher than the upper surface of the gate insulating film 21 and lower than the upper surface of the first electrode film 12.

Furthermore, the upper surface of the Si substrate 10 in the cell region 104 is substantially equal in height to the upper surface of the Si substrate 10 in the LV transistor region 103 described above. Thus, the upper surfaces of the gate insulating films 21 in the LV transistor region 103 and the cell region 104 coincide in height with each other. In addition, a P-well region 10a is formed in the Si substrate 10 corresponding to the cell region 104. Moreover, an N-well region 10b is formed under the P-well region 10a.

In general, in the NAND-type flash memory, a plurality of memory cell transistors MC are connected in series. One end of this cell sequence is connected to the bit line BL via a drain side select transistor, and the other end is connected to a source line via a source side select transistor.

In the HV transistor region 102, a contact (upper wiring line) 205 and a contact (upper wiring line) 206 are formed. The contact 205 penetrates a seventh insulating film 22 and an eighth insulating film 23, and contacts to the metal salicide film 16. The contact 206 penetrates the fifth insulating film 19, the sixth insulating film 20, the seventh insulating film 22 and the eighth insulating film 23, and contacts to the diffusion layer region 18b.

Furthermore, a contact (upper wiring line) 305 and a contact (upper wiring line) 306 are formed in the LV transistor region 103. The contact 305 penetrates the seventh insulating film 22 and the eighth insulating film 23, and contacts to the metal salicide film 16. The contact 306 penetrates the fifth insulating film 19, the sixth insulating film 20, the seventh insulating film 22 and the eighth insulating film 23, and contacts to the diffusion layer region 18b.

In addition, an upper surface of the gate electrode unit 203 of the HV transistor 201, that of the gate electrode unit 303 of the LV transistor 301 and that of the gate electrode unit 403 of the memory cell transistor MC is substantially equal in height.

In the case of the present embodiment, the HV transistor region 102 and the LV transistor region 103 have different element isolation structures. That is, the STI 204 in the HV transistor region 102 has a first region 204Y and a second region 204X having a bottom surface deeper than the bottom surface of the first region 204Y. A bottom surface of the first region 204Y is equal to the bottom surface of the STI 304 in the LV transistor region 103. As shown in FIG. 2A, a side surface of the first region 204Y is in contact with the gate insulating film 11 and the first electrode film 12 in the channel width direction. The second region 204X is formed between the first regions 204Y in the channel width direction. That is, the first region 204Y and the second region 204X are connected to each other in the channel width direction.

On the other hand, as shown in FIG. 2B, the STI 204 is only formed of the first region 204Y in the channel length direction. That is, the STI 204 constructs only the first region 204Y in the channel length direction of the LV transistor region 103. The difference of the bottom surface of between the first region 204Y and the second region 204X is equal to the difference of thickness between the gate insulating film 11 and the first electrode film 12 (in this example, about 30 nm). Thus, when the STI 304 in the LV transistor region 103 is shallow enough to prevent the generation of crystal defects, the STI 204 in the HV transistor region 102 can be deep enough to reduce an increase in an STI inversion leakage, due to formed second region 204X. Moreover, the connecting portion from the first region 204Y to the second region 204X has a gradually deepening smooth shape from the first region 204Y to the second region 204X, so that the electric field concentration on the connecting portion can be reduced. This makes it possible to prevent channel formation in the connecting portion and effectively prevent an increase in the STI inversion leakage. The second region 204X having such a shape can be automatically formed during the fabrication of the STIs 204, 304, for example, by a later-described fabrication of a gate insulating film. That is, the gate insulating film 21 formed in a formation part of the STI 204 in the HV transistor region 102 of the peripheral circuit region 101.

A P-type diffusion layer region FT (impurity region of the first conductivity type) with a high impurity concentration, for example, may be formed in the Si substrate 10 under the second region 204X of the STI 204 in the channel width direction and under the first region 204Y of the STI 204 in the channel length direction. In this case, an STI inversion leakage can be effectively prevented.

The gate length of the HV transistor 201 is 1 µm to 10 µm and large so that the HV transistor 201 may not break down even if a high voltage is applied across the source and drain of the element region 202. On the other hand, the gate length of the LV transistor 301 is 0.15 µm to 0.5 µm and small for high-speed operation. That is, in the channel length direction, the element region 202 of the HV transistor 201 is longer than the element region 302 of the LV transistor 301. Therefore, the HV transistor 201 can be said to have a strong structure to the stress of the PSZ film, and crystal defects are not easily happened in the HV transistor 201 even if the sectional area of the STI 204 in the channel length direction is deeper.

Next, a method of manufacturing such NAND-type flash memory is described with reference to FIGS. 3A to 3D through FIGS. 15A to 15D. In addition, "A" of each figure is a sectional view corresponding to FIG. 2A, "B" of each figure is a sectional view corresponding to FIG. 2B, "C" of each figure is a sectional view corresponding to FIG. 2C, and "D" of each figure is a sectional view corresponding to FIG. 2D.

First, as shown in FIGS. 3A to 3D, the upper surface of the Si substrate 10 corresponding to the HV transistor region 102 is etched so that an upper surface of the gate electrode unit 203 of the HV transistor 201, that of the gate electrode unit 303 of the LV transistor 301, and that of the gate electrode unit 403 of the memory cell transistor MC may be uniform in height.

Then, as shown in FIGS. 4A to 4D, a first insulating film such as a silicon oxide film serving as the gate insulating film 11 of the HV transistor 201 is deposited with a thickness of about 40 nm on the entire surface of the Si substrate 10. In addition, before and after the formation of the first insulating film, the P-well regions 10a are formed on the surface parts of the Si substrate 10 corresponding to the LV transistor region 103 and the cell region 104. When the LV transistor 301 is a p-type transistor, an N-well region is formed on the Si substrate 10 corresponding to the LV transistor region 103. Further, the N-well region 10b is formed under the P-well region 10a in the cell region 104.

Then, as shown in FIGS. 5A to 5D, a second insulating film serving as the gate insulating film 21 of the LV transistor 301 is formed with a thickness of about 8 nm on the upper surface of the Si substrate 10 corresponding to the LV transistor region 103 by a lithographic technique and an etching technique. Further, a second insulating film serving as the gate insulating film (tunnel insulating film) 21 of the memory cell transistor MC is formed with a thickness of about 8 nm on the upper surface of the Si substrate 10 corresponding to the cell region 104 by a thermal oxidation method or CVD method. At the same time, the gate insulating film 21 is also formed with a thickness of about 8 nm in the second region 204X for forming prediction of the element isolation STI 204 in the HV transistor region 102 (gate insulating film fabrication). As a result, a step corresponding to the difference of thickness (in this example, about 30 nm) between the gate insulating film 11 and the gate insulating film 21 is formed in the formation part of the STI 204 in the HV transistor region 102.

Here, in the STI 204 in the HV transistor region 102 in the channel width direction, a region to serve as the gate insulating film 21 is the second region 204X, and a region to serve as the gate insulating film 11 is the first region 204Y. Moreover, the connecting portion between the first region 204Y and the second region 204X has a shape that gradually becomes lower toward the second region 204X.

In this case, the upper surface of the Si substrate 10 is substantially equal in the first region 204Y and the second region 204X of the HV transistor region 102. On the other hand, the upper surface of the Si substrate 10 corresponding to the LV transistor region 103 is higher than the upper surface of the Si substrate 10 in the first region 204Y and the second region 204X of the HV transistor region 102. That is, while the thickness of the gate insulating film 21 in the second region 204X of the HV transistor region 102 is the same as the thickness of the gate insulating film 21 in the LV transistor region 103, the lower surface of the gate insulating film 21 in the second region 204X of the HV transistor region 102 is lower than the lower surface of the gate insulating film 21 in the LV transistor region 103.

A higher capacity in the second region 204X is preferred to prevent in the STI inversion leakage. If the second region 204X is too large in channel width direction, the thickness of the gate insulating film 11 located in the vicinity of the STI 204 may be equal to the thickness of the gate insulating film 21 due to, for example, process fluctuation during a lithographic step. That is, it is preferable to form the second region 204X into the maximum size that allows for the process fluctuation during the lithographic step.

As shown in FIGS. 6A to 6D, the first electrode film 12 serving as the floating gate electrode of the memory cell transistor MC is deposited all over the surface. On the first electrode film 12, a first mask material 31 to form the STIs 204, 304, 404 is deposited with a uniform thickness.

As shown in FIGS. 7A to 7D, element isolation trenches (first, second, third and fourth trenches) 204a, 304a, 404a to form the STIs 204, 304, 404 are formed by the lithographic technique and the etching technique. In this case, the depth of the element isolation trenches 204a, 304a, 404a is adjusted so that at least the STI 304 has a depth that prevents the generation of crystal defects in the LV transistor region 103 and that does not cause problems such as a junction leakage in HV transistor region 102. During the formation of the element isolation trenches 204a, 304a, 404a, a step which is formed in the formation part of the STI 204 in the HV transistor region 102 and which corresponds to the difference of thickness between the gate insulating film 11 and the gate insulating film 21 is transferred onto the bottom of the element isolation trench 204a. Thus, the second region 204X deeper than the STI 304 in the LV transistor region 103 can be formed in part of the bottom surface of the STI 204 in the HV transistor region 102.

In addition, it is assumed that the etching here is performed with no selectivity between the gate insulating films 11, 21 and the Si substrate 10. For example, when the etching rate of the gate insulating films 11, 21 is equal to the etching rate of the Si substrate 10, the position of the bottom surface of the first region 204Y of the element isolation trench 204a and the positions of the bottom surfaces of the element isolation trenches 304a, 404a are about the same in the first region 204Y of the HV transistor region 102, the LV transistor region 103 and the cell region 104. However, as the etching rate decreases when the width of the element isolation trench is smaller, the element isolation trench 404a in the cell region 104 may be shallower than the element isolation trench 304a in the LV transistor region 103. Thus, "the positions of the bottom surfaces of the element isolation trenches 204a, 304a, 404a are about the same" means the case where the HV transistor region 102, the LV transistor region 103 and the cell region 104 are simultaneously etched under the same conditions.

On the contrary, when the etching rate of the Si substrate 10 is higher than the etching rate of the gate insulating films 11, 21, the distance from the surface of the Si substrate 10 to the bottom surface of the first region 204Y and the second region 204X of the element isolation trench 204a is same relationship when no etching selectivity between the gate insulating films 11, 21 and the Si substrate 10. Moreover, the distance from the surface of the Si substrate 10 to the bottom surface of the second region 204X of the element isolation trench 204a is larger than the distance from the surface of the Si substrate 10 to the bottom surface of the first region 204Y of the element isolation trench 204a. That is, even when the etching rate of the gate insulating films 11, 21 is different from the etching rate of the Si substrate 10, it is only necessary that the first region 204Y of the element isolation trench 204a in the HV transistor region 102 be formed with sufficient depth to prevent in the STI inversion leakage.

Then, as shown in FIGS. 8A to 8D, the coating films such as PSZ films are embedded in the element isolation trenches 204a, 304a, 404a, and then the upper surfaces of the coating films are planarized using the mask material 31 as a stopper. Thus, the STI 204 in the HV transistor region 102, the STI 304 in the LV transistor region 103 and the STI 404 in the cell region 104 are formed.

After the STIs 204, 304, 404 have been formed, a P-type diffusion layer region (impurity region of the first conductivity type) with a high impurity concentration, for example, may be formed in the Si substrate 10 under the second region 204X of the STI 204. In this case, an STI inversion leakage can be effectively prevented.

As shown in FIGS. 9A to 9D, the upper surfaces of the STIs 204, 304, 404 are aligned in height with the upper surface of the first electrode film 12 by etching.

As shown in FIGS. 10A to 10D, the upper surface of the STI 404 in the cell region 104 is made further lower than the upper surface of the first electrode film 12 by etching. Further, after the mask material 31 is removed, a third insulating film to form the intergate insulating film 13 in the memory cell transistor MC and the second electrode film 14 to form the first control gate electrode in the memory cell transistor MC are deposited in order all over the surface.

As shown in FIGS. 11A to 11D, in order to electrically connect the first and second electrode films 12, 14 to the third electrode film 15 serving as the second control gate electrode in the memory cell transistor MC, the second electrode film 14 and the third insulating film 13 are partly detached in the HV transistor region 102 and the LV transistor region 103. Subsequently, the third electrode film 15 and an insulating film 32 are deposited in order all over the surface.

As shown in FIGS. 12A to 12D, the gate electrode unit 203 of the HV transistor 201, the gate electrode unit 303 of the LV transistor 301, and the gate electrode unit 403 of the memory cell transistor MC are processed (patterned) by the lithographic technique and the etching technique. Moreover, as shown in, for example, FIGS. 12B and 12C, an N-type impurity is implanted into the surface parts of the Si substrate 10 corresponding to the element regions 202, 302 to form the diffusion layer region 18a. After the fourth insulating film is deposited, a selective etching technique is used to form, on the sidewall of the gate electrode unit 203, the spacer film 17 which is a gate sidewall structure of the HV transistor 201 and to form, on the sidewall of the gate electrode unit 303, the spacer film 17 which is a gate sidewall structure of the LV transistor 301. Subsequently, an N-type impurity is selectively implanted into the surface part of the Si substrate 10 to form the diffusion layer region 18b.

In addition, the fourth insulating film is an insulating film which can provide a desired etching selectivity among the first electrode film 12, the second electrode film 14 and the third electrode film 15. When a p-type transistor is to be formed, a P-type impurity is implanted instead of the N-type impurity.

Figures 13A, 13B, 13C, 13D:
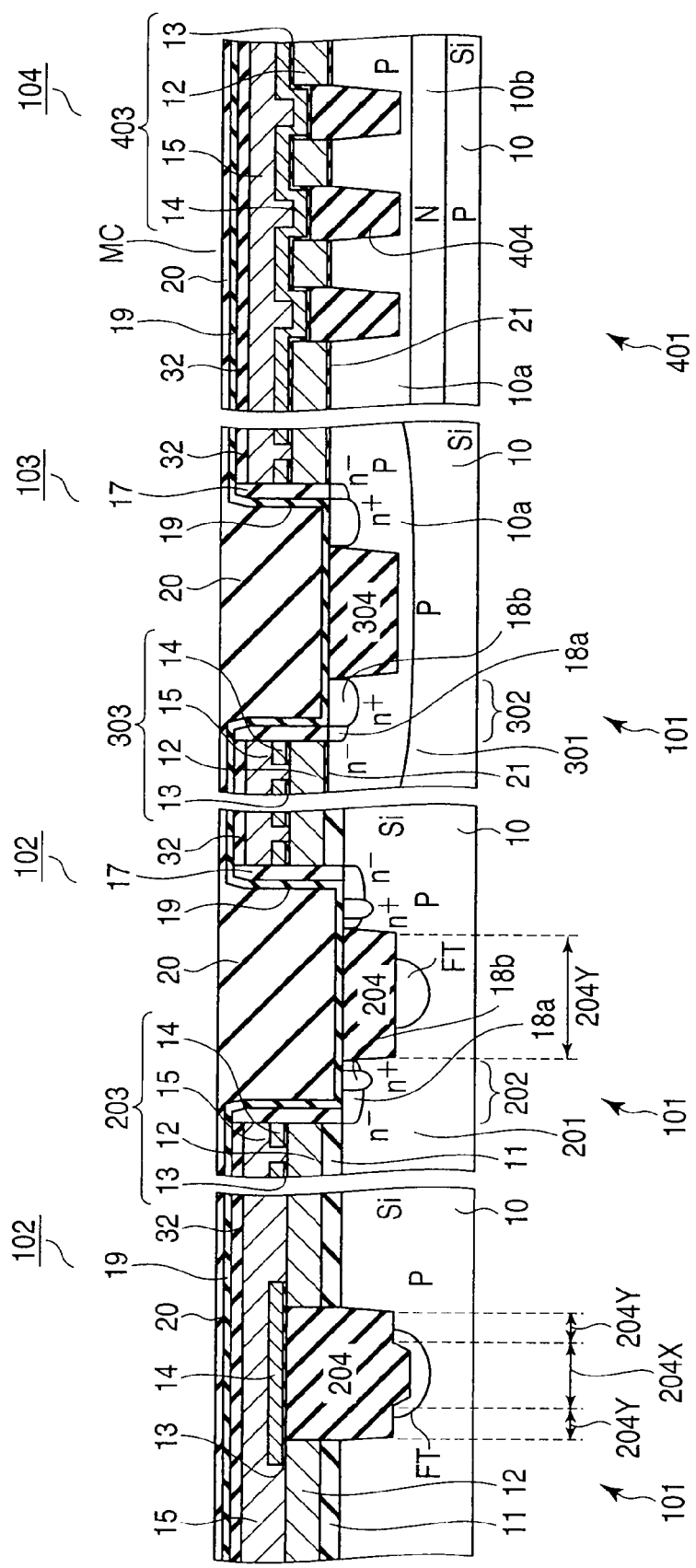
FIGS. 13A to 13D are sectional views shown to explain the process of manufacturing the NAND-type flash memory according to the first embodiment.

As shown in FIGS. 13A to 13D, the fifth insulating film 19 and the sixth insulating film 20 are deposited in order all over the surface.

Figures 14A, 14B, 14C, 14D:
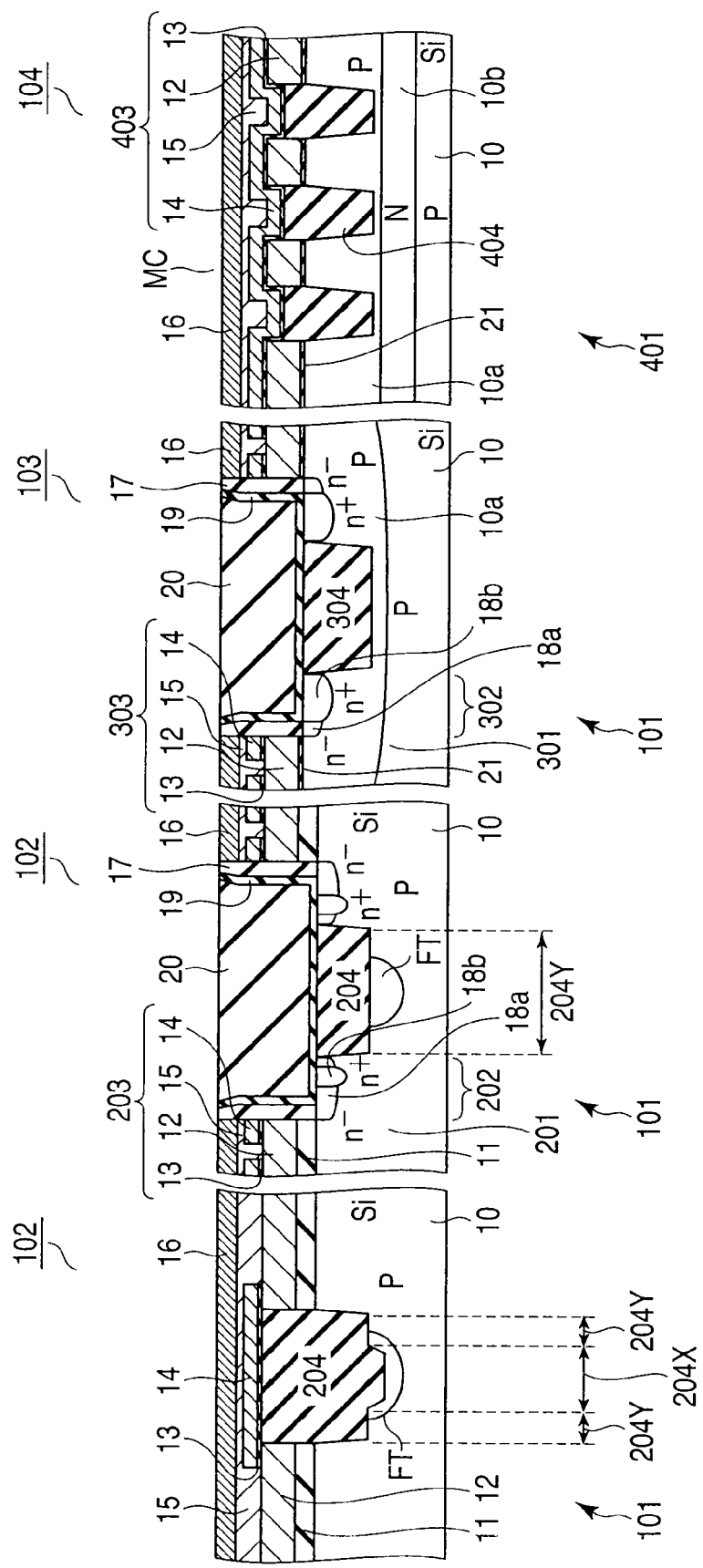
FIGS. 14A to 14D are sectional views shown to explain the process of manufacturing the NAND-type flash memory according to the first embodiment.

As shown in FIGS. 14A to 14D, the upper surfaces of the fifth insulating film 19 and the sixth insulating film 20 are planarized to be equal in height to the upper surface of the spacer film 17, and the insulating film 32 on the gate electrode units 203, 303 of the HV transistor 201 and the LV transistor 301 is detached by the etching technique. Subsequently, the metal salicide film 16 is formed in the part where the insulating film 32 has been detached.

As shown in FIGS. 15A to 15D, the seventh insulating film 22 and the eighth insulating film 23 are deposited in order all over the surface.

After a general contact formation step and wiring line formation step, a NAND-type flash memory having the configuration shown in FIGS. 1A to 1C and FIGS. 2A to 2D is completed. That is, the contact 205 and the contact 206 are formed in the HV transistor region 102, wherein the contact 205 penetrates the seventh insulating film 22 and the eighth insulating film 23 and is coupled to the metal salicide film 16, while the contact 206 penetrates the fifth insulating film 19, the sixth insulating film 20, the seventh insulating film 22 and the eighth insulating film 23 and is coupled to the diffusion layer region 18b. In the LV transistor region 103, the contact 305 and the contact 306 are formed, wherein the contact 305 penetrates the seventh insulating film 22 and the eighth insulating film 23 and is coupled to the metal salicide film 16, while the contact 306 penetrates the fifth insulating film 19, the sixth insulating film 20, the seventh insulating film 22 and the eighth insulating film 23 and is coupled to the diffusion layer region 18b. In the cell region 104, a source line contact, a source line, a bit line contact, a bit line, etc. that are not shown are formed.

As described above, when a coating film such as the PSZ film having high contraction stress is used for the embedded element isolation insulating film in the process of simultaneously forming the STI in the HV transistor region and the STI in the LV transistor region, part of the bottom surface of the embedded element isolation insulating film in the HV transistor region of the peripheral circuit section is projected downward. In other words, the formation part of the STI in the HV transistor region is subjected to the fabrication of a gate insulating film so that a downward projection (second region) deeper than other parts is formed in the bottom surface of the STI in the HV transistor region during the formation of the STI. Thus, the second region having a depth corresponding to the difference of thickness between the gate insulating films can be automatically formed in the bottom surface of the STI in the HV transistor region simultaneously with the formation of the STI having a depth that can prevent the generation of crystal defects in the LV transistor region. Accordingly, the thickness (amount) of the embedded element isolation insulating film in the STI in the HV transistor region can be increased by the amount of the second region. Thus, the generation of crystal defects in the LV transistor region can be prevented. Moreover, in the HV transistor region, the STI inversion leakage can be prevented owing to the embedded element isolation insulating film having a sufficient thickness.

In particular, the gate electrode unit 203 is formed on the STI 204 in the channel width direction. Therefore, the STI inversion leakage is easily caused if a voltage is applied to the gate electrode unit 203. Thus, when the bottom surface of the STI 204 in the channel width direction is deep as in the present embodiment, the STI inversion leakage can be effectively prevented.

Moreover, as the fabrication of the gate insulating film can be easily performed by simple correction of a mask pattern, it is possible to easily obtain a NAND-type flash memory having STIs of different element isolation structures in the LV transistor region and the HV transistor region without any additional steps or complication of manufacture.

Modification 1 of First Embodiment

Figures 16A, 16B, 16C, 16D:
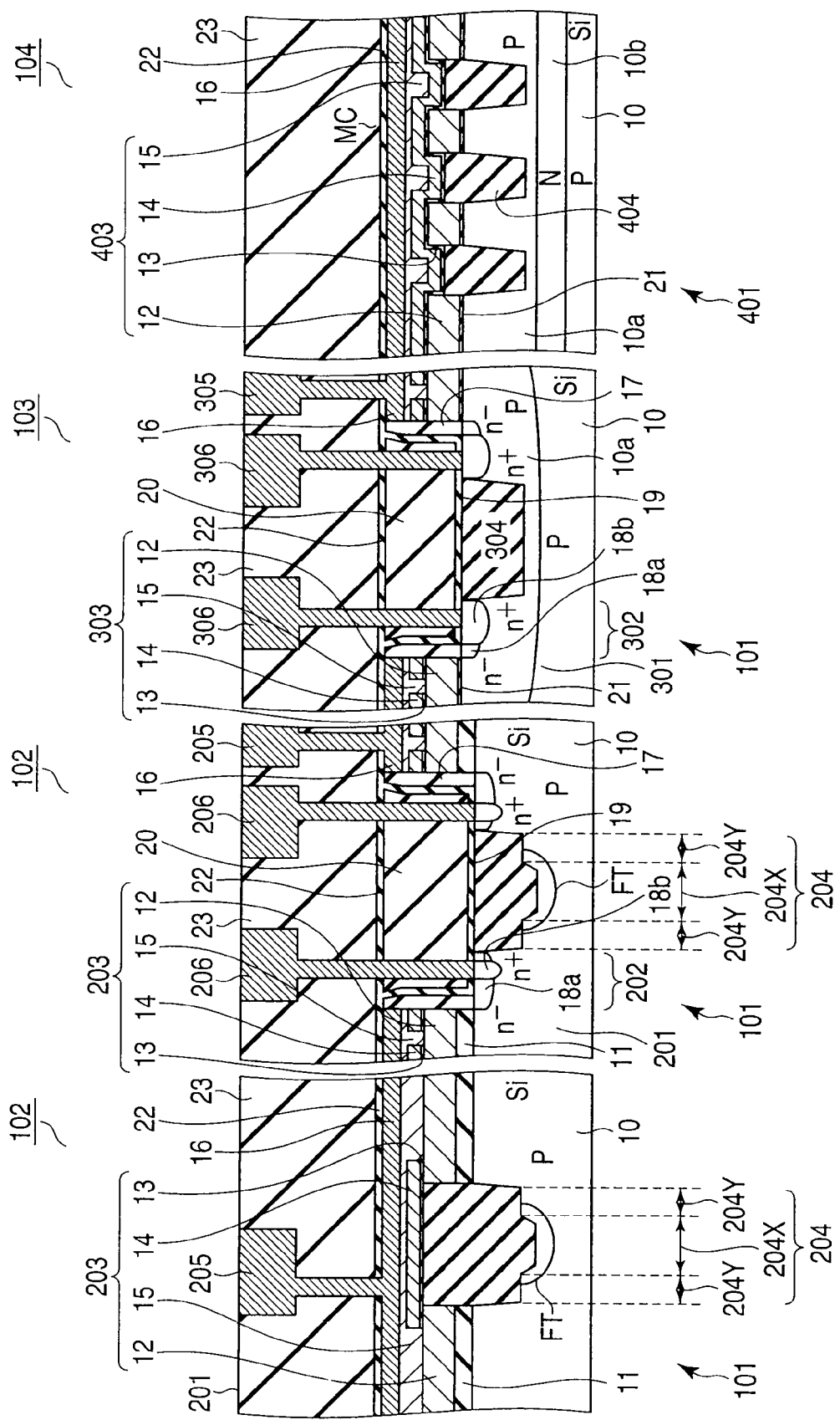
FIGS. 16A to 16D are sectional views showing an example of the configuration of a NAND-type flash memory according to Modification 1 of the first embodiment.

FIGS. 16A to 16D show Modification 1 of the first embodiment. Modification 1 is different from the above-described first embodiment in that a second region 204X is formed between first regions 204Y in the channel length direction as well. That is, the shape of an STI 204 in the channel length direction is the same as that in the channel width direction. As a result, the bottom of the STI 204 can be deeper in the channel length direction than in the first embodiment, so that the STI inversion leakage can be prevented even if there is a large potential difference between diffusion layer regions 18a, 18b of an HV transistor 201 adjoining across the STI 204.

A semiconductor device manufacturing method according to Modification 1 of the first embodiment is described below.

It should be noted that the same signs are provided to the same parts as in the above-described first embodiment and detailed explanations are omitted.

A P-type diffusion layer region FT (impurity region of the first conductivity type) with a high impurity concentration, for example, may be formed in the Si substrate 10 under the second region 204X of the STI 204 in the channel width direction and in the channel length direction. In this case, an STI inversion leakage can be effectively prevented.

The present embodiment is similar to the first embodiment up to FIGS. 4A to 4D. Then, as shown in FIGS. 17A to 17D, a step (gate insulating film 21) corresponding to the difference of thickness between a gate insulating film 11 in an HV transistor region 102 and a gate insulating film 21 in an LV transistor region 103 is formed in a formation part of the STI 204 in the HV transistor region 102 in the channel length direction as in the channel width direction.

Here, a region to serve as the gate insulating film 21 is the second region 204X, and a region to serve as the gate insulating film 11 is the first region 204Y. Moreover, the connecting portion between the first region 204Y and the second region 204X has a shape that gradually becomes lower toward the second region 204X.

Figures 18A, 18B, 18C, 18D:
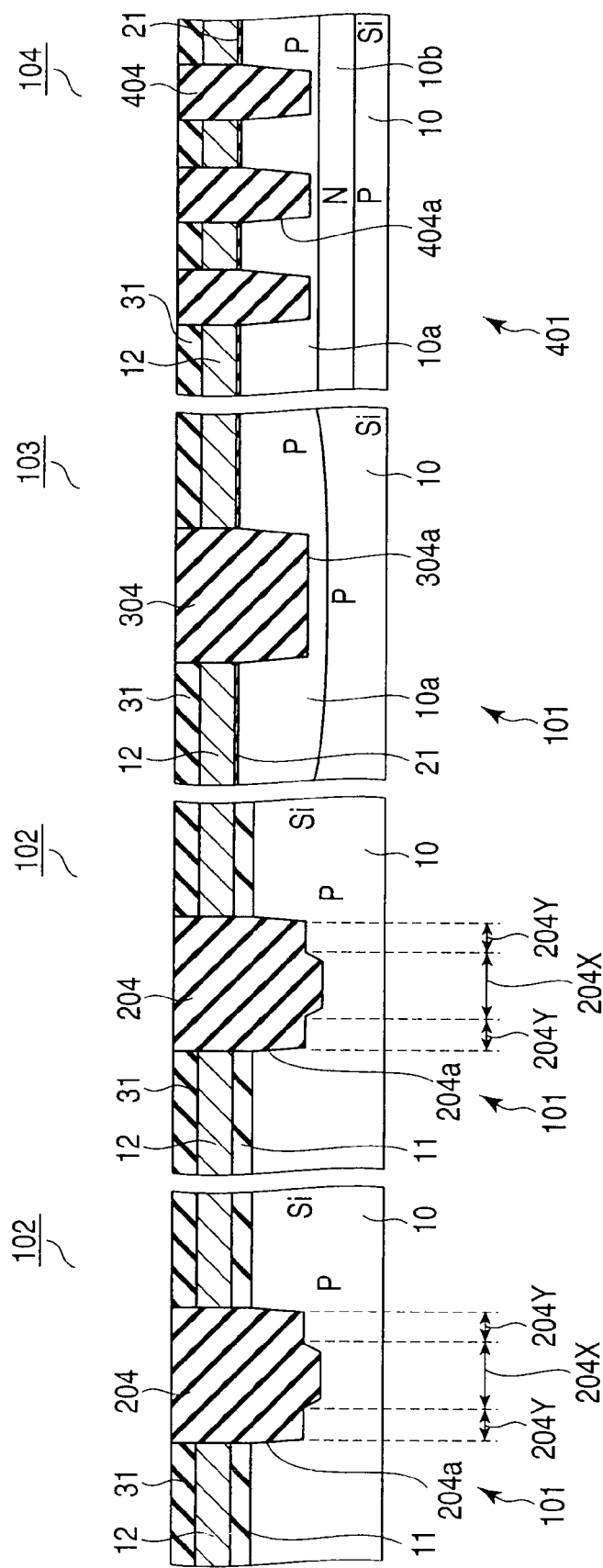
FIGS. 18A to 18D are sectional views shown to explain the process of manufacturing the NAND-type flash memory according to Modification 1 of the first embodiment.

As shown in FIGS. 18A to 18D, after element isolation trenches 204a, 304a, 404a are simultaneously formed, coating films such as PSZ films are embedded therein to form the STI 204 in the HV transistor region 102, an STI 304 in the LV transistor region 103 and an STI 404 in a cell region 104.

Figures 19A, 19B, 19C, 19D:
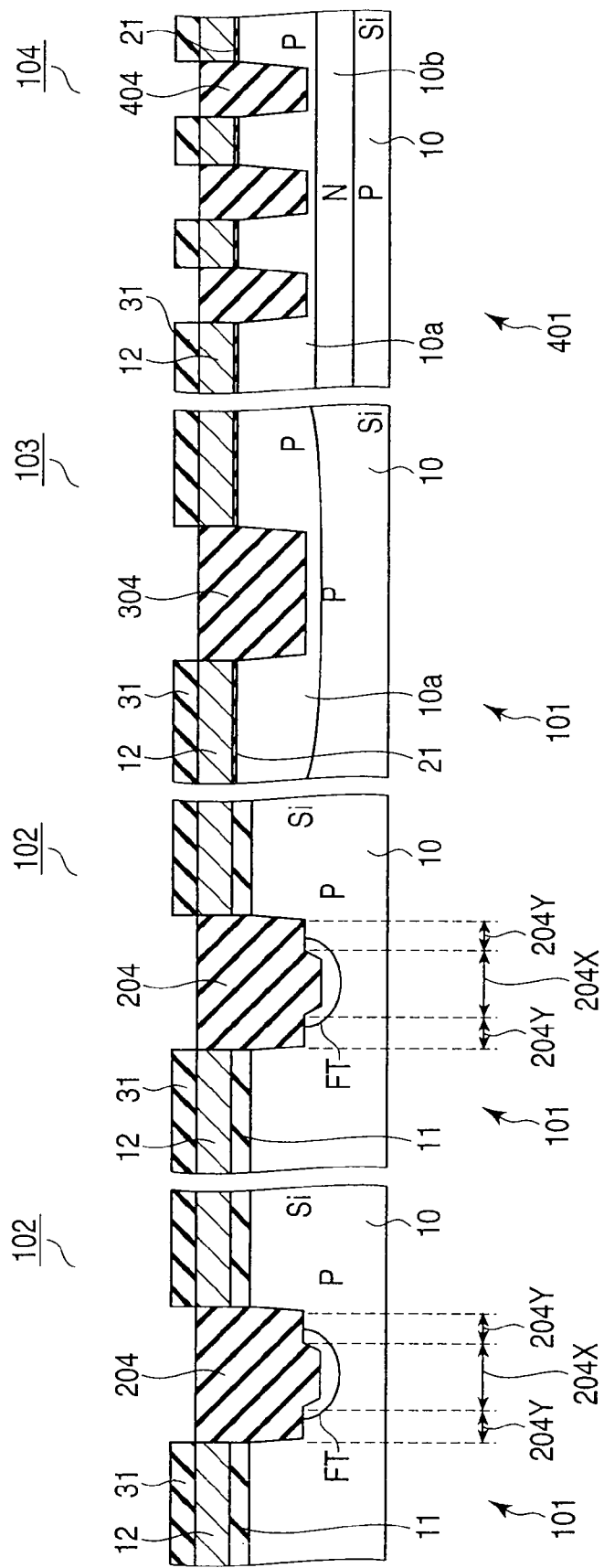
FIGS. 19A to 19D are sectional views shown to explain the process of manufacturing the NAND-type flash memory according to Modification 1 of the first embodiment.

As shown in FIGS. 19A to 19D, the upper surfaces of the STIs 204, 304, 404 are aligned in height with the upper surface of a first electrode film 12 by etching.

As shown in FIGS. 20A to 20D, the upper surface of the STI 404 in the cell region 104 is made further lower than the upper surface of the first electrode film 12 by etching. Further, after a mask material 31 is removed, a third insulating film to form the intergate insulating film 13 in a memory cell transistor MC and a second electrode film 14 to form a first control gate electrode in the memory cell transistor MC are deposited in order all over the surface.

As shown in FIGS. 21A to 21D, in order to electrically connect the first, second electrode films 12, 14 to a third electrode film 15 serving as a second control gate electrode in the memory cell transistor MC, the second electrode film 14 and the third insulating film 13 are partly detached in the HV transistor region 102 and the LV transistor region 103. Subsequently, the third electrode film 15 and an insulating film 32 are deposited in order all over the surface.

Figures 22A, 22B, 22C, 22D:
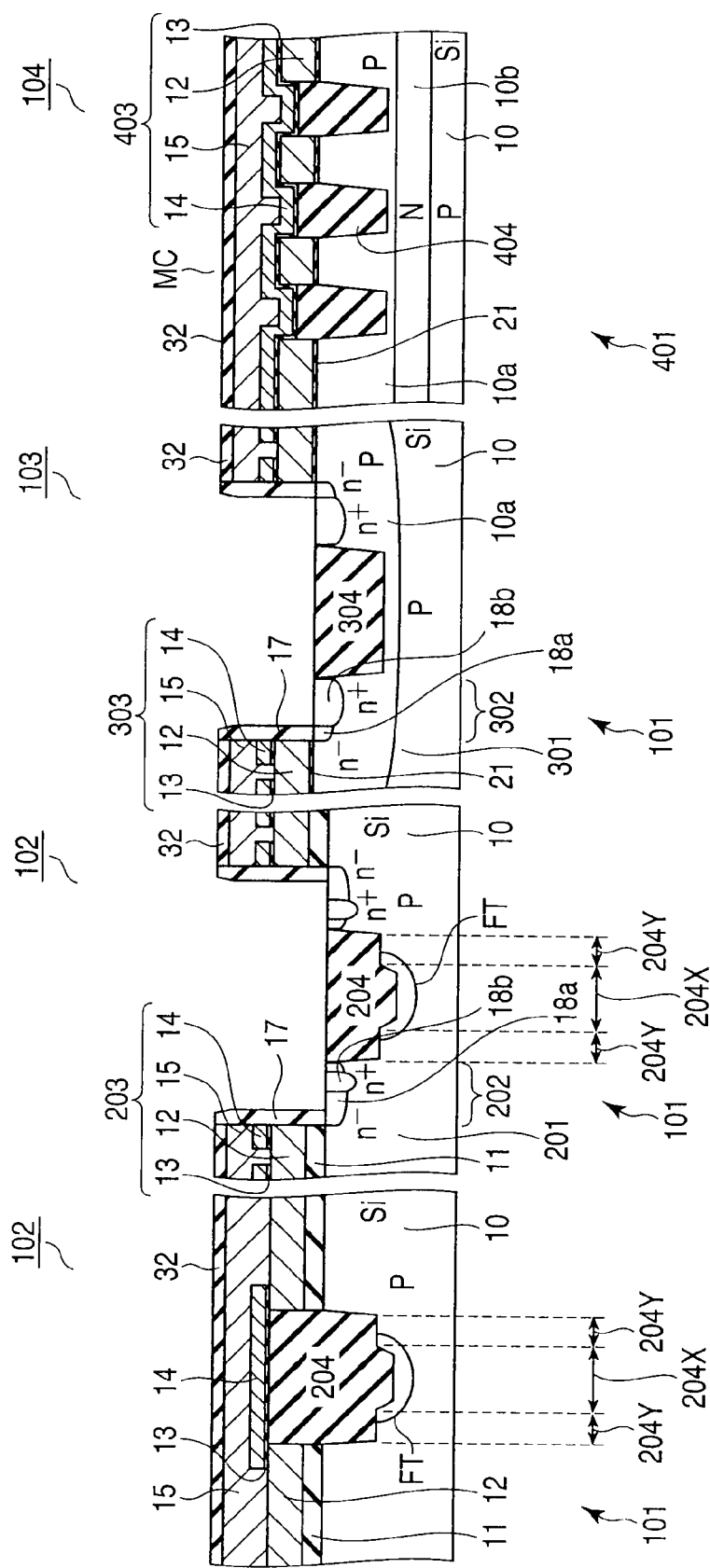
FIGS. 22A to 22D are sectional views shown to explain the process of manufacturing the NAND-type flash memory according to Modification 1 of the first embodiment.

As shown in FIGS. 22A to 22D, the gate electrode unit 203 of the HV transistor 201, the gate electrode unit 303 of the LV transistor 301, and the gate electrode unit 403 of the memory cell transistor MC are processed (patterned) by the lithographic technique and the etching technique. Moreover, as shown in, for example, FIGS. 22B and 22C, an N-type impurity is implanted into the surface parts of an Si substrate 10 corresponding to element regions 202, 302 to form the diffusion layer region 18a. After a fourth insulating film is deposited, the selective etching technique is used to form, on the sidewall of the gate electrode unit 203, a spacer film 17 which is a gate sidewall structure of the HV transistor 201 and to form a spacer film 17 which is a gate sidewall structure of the LV transistor 301 on the sidewall of the gate electrode unit 303. Subsequently, an N-type impurity is selectively implanted into the surface part of the Si substrate 10 to form the diffusion layer region 18b.

In addition, the fourth insulating film is an insulating film which can provide a desired etching selectivity among the first electrode film 12, the second electrode film 14 and the third electrode film 15. When a p-type transistor is to be formed, a P-type impurity is implanted instead of the N-type impurity.

Figures 23A, 23B, 23C, 23D:
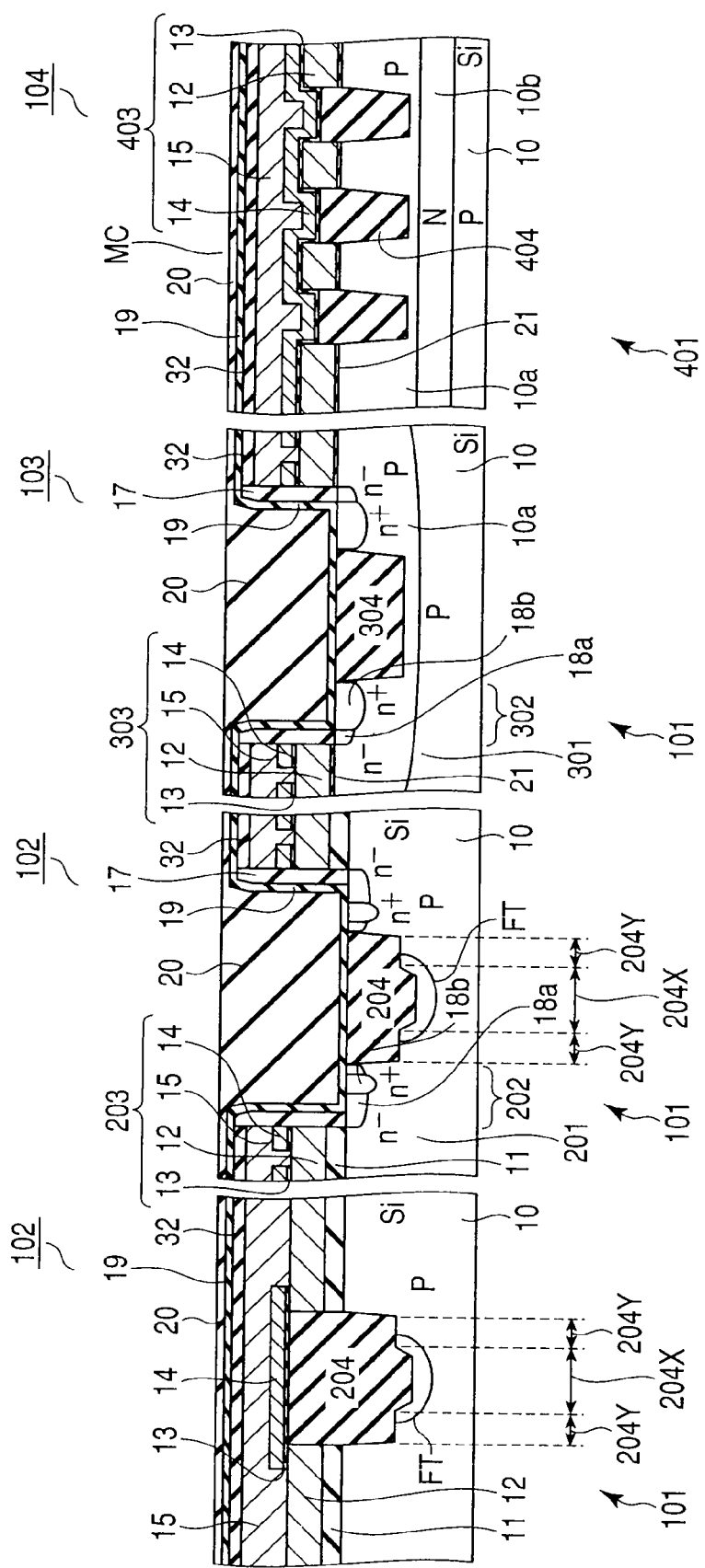
FIGS. 23A to 23D are sectional views shown to explain the process of manufacturing the NAND-type flash memory according to Modification 1 of the first embodiment.

As shown in FIGS. 23A to 23D, a fifth insulating film 19 and a sixth insulating film 20 are deposited in order all over the surface.

Figures 24A, 24B, 24C, 24D:
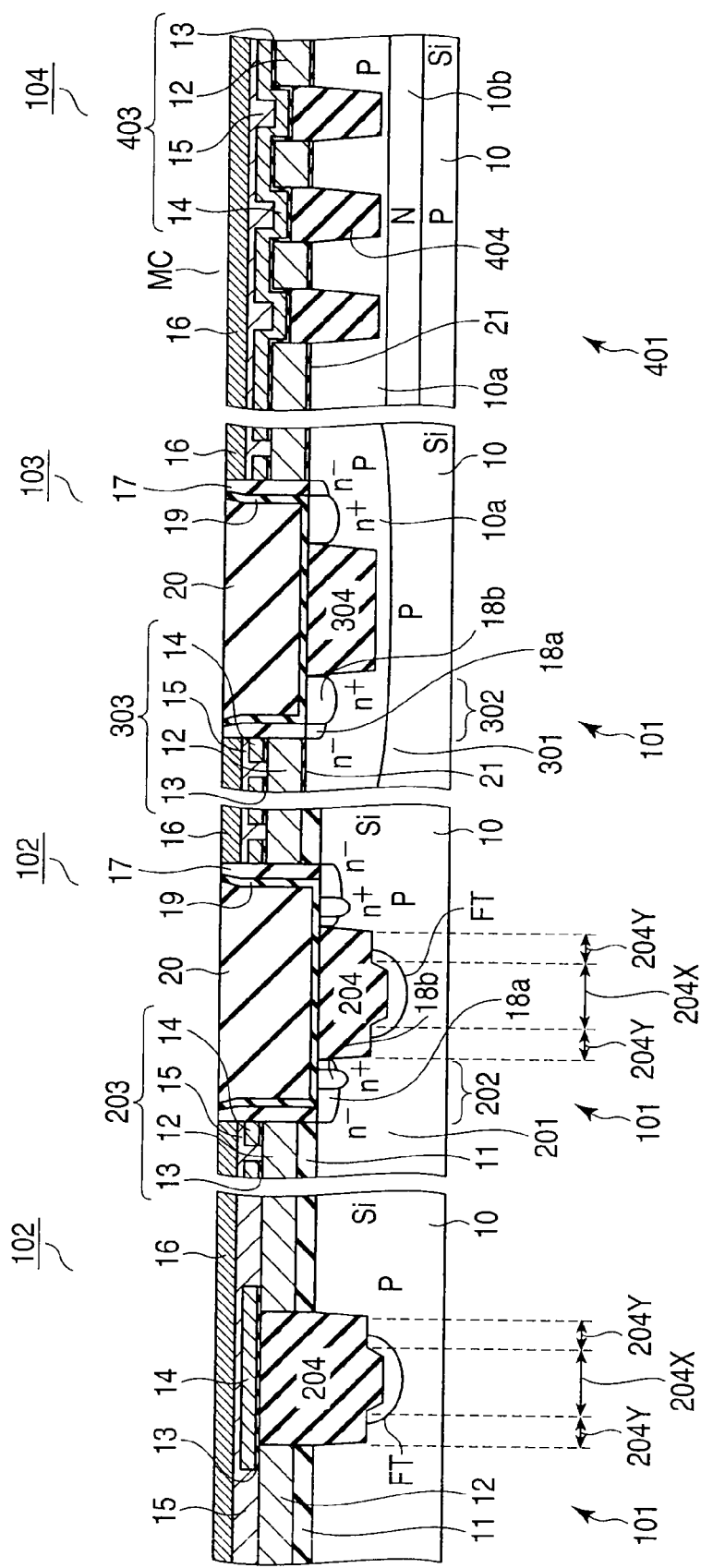
FIGS. 24A to 24D are sectional views shown to explain the process of manufacturing the NAND-type flash memory according to Modification 1 of the first embodiment.

As shown in FIGS. 24A to 24D, the upper surfaces of the fifth insulating film 19 and the sixth insulating film 20 are planarized to be equal in height to the upper surface of the spacer film 17, and the insulating film 32 on the gate electrode units 203, 303 of the HV transistor 201 and the LV transistor 301 is detached by the etching technique. Subsequently, the metal salicide film 16 is formed in the part where the insulating film 32 has been detached.

As shown in FIGS. 25A to 25D, a seventh insulating film 22 and an eighth insulating film 23 are deposited in order all over the surface.

After a general contact formation step and wiring line formation step, a NAND-type flash memory having the configuration shown in FIGS. 16A to 16D is completed. That is, a contact 205 and a contact 206 are formed in the HV transistor region 102, wherein the contact 205 penetrates the seventh insulating film 22 and the eighth insulating film 23 and is coupled to the metal salicide film 16, while the contact 206 penetrates the fifth insulating film 19, the sixth insulating film 20, the seventh insulating film 22 and the eighth insulating film 23 and is coupled to the diffusion layer region 18b. In the LV transistor region 103, a contact 305 and a contact 306 are formed, wherein the contact 305 penetrates the seventh insulating film 22 and the eighth insulating film 23 and is coupled to the metal salicide film 16, while the contact 306 penetrates the fifth insulating film 19, the sixth insulating film 20, the seventh insulating film 22 and the eighth insulating film 23 and is coupled to the diffusion layer region 18b. In the cell region 104, a source line contact, a source line, a bit line contact, a bit line, etc. that are not shown are formed.

In the configuration of Modification 1, it is also possible to prevent the generation of crystal defects in the LV transistor, which is a trade-off, and at the same time, to prevent in an STI inversion leakage in the HV transistor.

While the NAND-type flash memory has been described by way of example in the above embodiments, the present invention is not limited to this. For example, the present invention is also applicable to various semiconductor devices having different element isolation structures in an LV transistor region and an HV transistor region.

Moreover, without being limited to the PSZ film, it is possible to use various insulating films having high contraction stress as well as a coating film of, for example, NSG or spin on glass (SOG).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
a semiconductor substrate;
a first gate insulating film and a second gate insulating film, the first gate insulating film being provided in a first transistor region on the semiconductor substrate, the second gate insulating film being provided in a second transistor region on the semiconductor substrate and being smaller in thickness than the first gate insulating film;

a plurality of first metal oxide semiconductor (MOS) transistors formed on the first gate insulating film and each of the first MOS transistors has a first gate electrode;

a plurality of second MOS transistors formed on the second gate insulating film and each of the second MOS transistors has a second gate electrode;

a first element isolation region in the first transistor region, the first element isolation region being provided between the plurality of first MOS transistors, the first element isolation region being formed by embedding an insulating film in the semiconductor substrate; and a second element isolation region in the second transistor region, the second element isolation region being provided between the plurality of second MOS transistors, the second element isolation region being formed by embedding the insulating film in the semiconductor substrate, wherein the first element isolation region has a first region and a second region;

a bottom surface of the second region is deeper than that of the first region by the difference of thickness between the first gate insulating film and the second gate insulating film; and a bottom surface of the first region is equal in a bottom surface of the second element isolation region.

2. The semiconductor device according to claim 1, wherein the first element isolation region includes the second region, and the first regions disposed on both sides of the second region.

3. The semiconductor device according to claim 1, wherein the second region in the first element isolation region is formed in a channel width direction between the plurality of the first MOS transistors.

4. The semiconductor device according to claim 3, wherein the first region in the first element isolation region is only formed in a gate length direction of the plurality of first MOS transistors.

5. The semiconductor device according to claim 1, wherein a connecting portion between the first region and the second region in the first element isolation region has a gradually smooth shape.

6. The semiconductor device according to claim 1, wherein an impurity region of the same conductivity type as the semiconductor substrate is formed in the semiconductor substrate under a part of the second region in the first element isolation region.

7. The semiconductor device according to claim 3, wherein the first gate electrode is formed on the first element isolation in the channel width direction.

8. The semiconductor device according to claim 1, further comprising a memory cell region on the semiconductor substrate, a plurality of memory cell transistors being arranged in the memory cell region, a third element isolation region being provided in the memory cell region, the third element isolation region being formed by embedding the insulating film in the semiconductor substrate between the plurality of memory cell transistors, wherein a bottom surface of the third element isolation region is equal to a bottom surface of the second element isolation region.

9. A semiconductor device comprising:

a semiconductor substrate of a first conductivity type having a first transistor region, a second transistor region and a memory cell region;

a first gate insulating film, a second gate insulating film and a third gate insulating film, the first gate insulating film being provided in the first transistor region on the semiconductor substrate, the second gate insulating film being provided in the second transistor region on the semiconductor substrate and being smaller in thickness than the first gate insulating film, the third gate insulating film being provided in the memory cell region on the semiconductor substrate and being equal in thickness to the second gate insulating film;

a plurality of first metal oxide semiconductor (MOS) transistors formed on the first gate insulating film and each of the first MOS transistors has first gate electrode;

a plurality of second MOS transistors formed on the second gate insulating film and each of the second MOS transistors has second gate electrode, the plurality of second MOS transistors operating at a lower voltage than the plurality of first MOS transistors;

a plurality of memory cell transistors formed on the third gate insulating film and having third gate electrode;

a first element isolation region in the first transistor region, the first element isolation region being provided between the plurality of first MOS transistors, the first element isolation region being formed by embedding an insulating film in the semiconductor substrate;

a second element isolation region in the second transistor region, the second element isolation region being provided between the plurality of second MOS transistors, the second element isolation region being formed by embedding the insulating film in the semiconductor substrate; and a third element isolation region in the memory cell region, the third element isolation region being provided between the plurality of memory cell transistors, the third element isolation region being formed by embedding the insulating film in the semiconductor substrate, wherein the first element isolation region has a first region and a second region;

a bottom surface of the second region is deeper than that of the first region by the difference of thickness between the first gate insulating film and the second gate insulating film; and a bottom surface of the first region is equal in a bottom surface of the second element isolation region.

10. The semiconductor device according to claim 9, wherein the first element isolation region includes the second region, and the first regions disposed on both sides of the second region.

11. The semiconductor device according to claim 10, wherein the second region in the first element isolation region is formed in a channel width direction between the plurality of the first MOS transistors.

12. The semiconductor device according to claim 11, wherein the first region in the first element isolation region is only formed in a gate length direction of the plurality of first MOS transistors.

13. The semiconductor device according to claim 9, wherein a connecting portion between the first region and the second region in the first element isolation region has a gradually smooth shape.

14. The semiconductor device according to claim 9, wherein an impurity region of the first conductivity type is formed in the semiconductor substrate under a part of the second region in the first element isolation region.

15. A semiconductor device manufacturing method comprising:

forming a first gate insulating film in a first part of a first transistor region on a semiconductor substrate;

forming a second gate insulating film in a second transistor region on the semiconductor substrate, the second gate insulating film being smaller in thickness than the first gate insulating film, and also forming the second gate insulating film in a second part of the first transistor region;

forming a first trench in the first part of the first transistor region, forming a second trench in the second part, a bottom of the second trench being deeper than that of the first trench by the difference of thickness between the first gate insulating film and the second gate insulating film, and forming a third trench in the second transistor region, a bottom of the third trench being equal in depth to that of the first trench;

embedding an insulating film in the first trench and the second trench to form a first element isolation region, and embedding the insulating film in the third trench to form a second element isolation region; and forming, via the first gate insulating film, a plurality of first metal oxide semiconductor (MOS) transistors in the first transistor region where the first element isolation region is formed, the plurality of first MOS transistors having first gate electrode, and forming, via the second gate insulating film, a plurality of second MOS transistors in the second transistor region where the second element isolation region is formed, the plurality of second MOS transistors having second gate electrode.

16. The semiconductor device manufacturing method according to claim 15, wherein an upper surface of the first gate insulating film in the first transistor region is equal in height to an upper surface of the first gate insulating film in second transistor region;

an surface of the second gate insulating film in the first transistor region is lower in height to the upper surface of the first gate insulating film in first transistor region.

17. The semiconductor device manufacturing method according to claim 15, wherein no selectivity between the first and second gate insulating films and the semiconductor substrate when forming the first to third trench.

18. The semiconductor device manufacturing method according to claim 15, wherein an surface of the second gate insulating film in the first transistor region is lower in height to the upper surface of the first gate insulating film in first transistor region between the first gate insulating film and the second gate insulating film.

19. The semiconductor device manufacturing method according to claim 15, wherein a connecting portion between the first trench and the second trench is formed to have a gradually smooth shape.

20. The semiconductor device manufacturing method according to claim 15, further comprising:

forming a third gate insulating film in a memory cell region on the semiconductor substrate so that the upper surface of the third gate insulating film is equal in height to the upper surface of the second gate insulating film, the third gate insulating film being equal in thickness to the second gate insulating film;

forming, in the memory cell region, a fourth trench having a bottom surface of the fourth trench equal in depth to a bottom surface of the third trench;

embedding the insulating film in the fourth trench to form a third element isolation region; and forming, via the third gate insulating film, a plurality of memory cell transistors in the memory cell region where the third element isolation region is formed, the plurality of memory cell transistors having third gate electrode.

* * * * *